United States Patent
Bidaux et al.

(10) Patent No.: US 12,416,691 B2
(45) Date of Patent: Sep. 16, 2025

(54) MAGNETIC SENSOR DEVICE

(71) Applicant: Melexis Technologies SA, Bevaix (CH)

(72) Inventors: Yves Bidaux, Bevaix (CH); Lionel Tombez, Bevaix (CH)

(73) Assignee: MELEXIS TECHNOLOGIES SA, Bevaix (CH)

( * ) Notice: Subject to any disclaimer, the term of this patent is extended or adjusted under 35 U.S.C. 154(b) by 0 days.

(21) Appl. No.: 18/467,928

(22) Filed: Sep. 15, 2023

(65) Prior Publication Data

US 2024/0003997 A1 Jan. 4, 2024

Related U.S. Application Data

(63) Continuation of application No. 17/506,098, filed on Oct. 20, 2021, now Pat. No. 11,796,609.

(30) Foreign Application Priority Data

Nov. 3, 2020 (EP) ..................................... 20205330

(51) Int. Cl.
*G01R 33/07* (2006.01)
*H10N 52/00* (2023.01)
(Continued)

(52) U.S. Cl.
CPC ............. *G01R 33/07* (2013.01); *H10N 52/01* (2023.02); *H10N 52/101* (2023.02); *H10N 52/80* (2023.02)

(58) Field of Classification Search
CPC ........ G01R 33/07; G01R 33/09; G01R 33/05; G01R 33/0011; H01N 52/01; H01N 52/101; H01N 52/80
See application file for complete search history.

(56) References Cited

U.S. PATENT DOCUMENTS

| 4,339,875 A | 7/1982 | Muller |
| 8,957,668 B2 | 2/2015 | Franke |

(Continued)

FOREIGN PATENT DOCUMENTS

| EP | 2006700 A2 | 12/2008 |
| EP | 3276365 A1 | 1/2018 |

(Continued)

OTHER PUBLICATIONS

Extended European Search Report from corresponding European Application No. 20205330.2, Apr. 13, 2021.

(Continued)

*Primary Examiner* — Dominic E Hawkins
(74) *Attorney, Agent, or Firm* — Workman Nydegger

(57) ABSTRACT

An integrated sensor device includes: a semiconductor substrate comprising a horizontal Hall element, and an integrated magnetic flux concentrator located substantially above said horizontal Hall element, wherein the first magnetic flux concentrator has a shape with a geometric center which is aligned with a geometric centre of the horizontal Hall element; and wherein the shape has a height H and a transversal dimension D, wherein H≥30 μm and/or wherein (H/D)≥25%. The integrated magnetic flux concentrator may be partially incorporated in the "interconnection stack". A method is provided for producing such an integrated sensor device.

20 Claims, 16 Drawing Sheets

(51) Int. Cl.
*H10N 52/01* (2023.01)
*H10N 52/80* (2023.01)

(56) References Cited

U.S. PATENT DOCUMENTS

| | | | |
|---|---|---|---|
| 9,116,198 B2* | 8/2015 | Cai | G01R 33/093 |
| 10,290,677 B2 | 5/2019 | Kishi et al. | |
| 10,337,887 B2* | 7/2019 | Nobira | G01R 33/02 |
| 10,816,318 B2* | 10/2020 | Vandersteegen | G01B 7/30 |
| 11,422,167 B2* | 8/2022 | Lee | H01L 23/49586 |
| 2002/0021124 A1* | 2/2002 | Schott | G01D 5/145 |
| | | | 324/207.2 |
| 2009/0309590 A1 | 12/2009 | Kataoka et al. | |
| 2010/0117638 A1 | 5/2010 | Yamashita et al. | |
| 2011/0244599 A1 | 10/2011 | Whig et al. | |
| 2014/0167749 A1 | 6/2014 | Kim et al. | |
| 2016/0245881 A1 | 8/2016 | Hioka et al. | |
| 2016/0276577 A1 | 9/2016 | Ebihara | |
| 2017/0271575 A1 | 9/2017 | Hioka et al. | |
| 2018/0006214 A1 | 1/2018 | Nakamura | |
| 2018/0135961 A1* | 5/2018 | Vandersteegen | G01B 7/30 |
| 2019/0113366 A1* | 4/2019 | Bilbao De Mendizabal | |
| | | | G01D 5/16 |
| 2022/0357369 A1* | 11/2022 | Lee | G01R 15/207 |

FOREIGN PATENT DOCUMENTS

| | | |
|---|---|---|
| EP | 3470863 A1 | 4/2019 |
| EP | 3742130 A1 | 11/2020 |
| EP | 3742182 A1 | 11/2020 |
| JP | H09129944 A | 5/1997 |
| JP | H11261131 A | 9/1999 |
| JP | 2010107320 A | 5/2010 |
| WO | 9854547 A1 | 12/1998 |
| WO | 2016129288 A1 | 8/2016 |
| WO | 2022015685 A1 | 1/2022 |

OTHER PUBLICATIONS

Extended European Search Report from corresponding European Application No. 20209345.6, May 14, 2021.
Japanese Office Action from corresponding JP Application No. 2021-171500, May 26, 2025.

* cited by examiner

FIG. 1(c)  $\Phi = \arc\tan\{(S_7 - S_6)/(S_5 - S_4)\}$

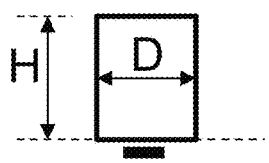
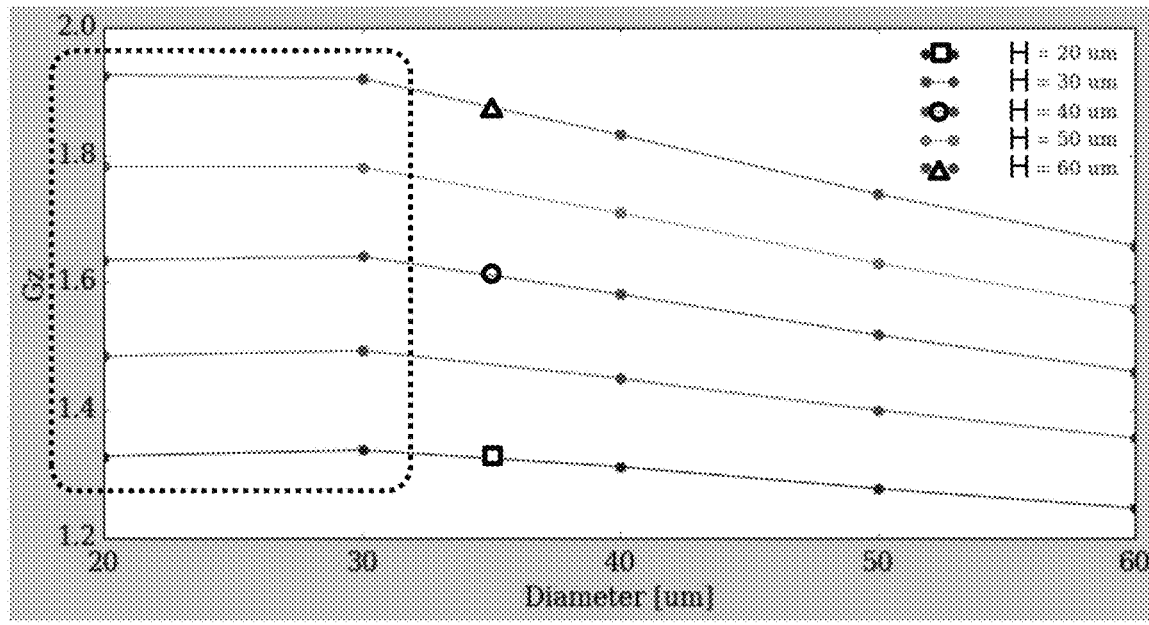
FIG 5(a)
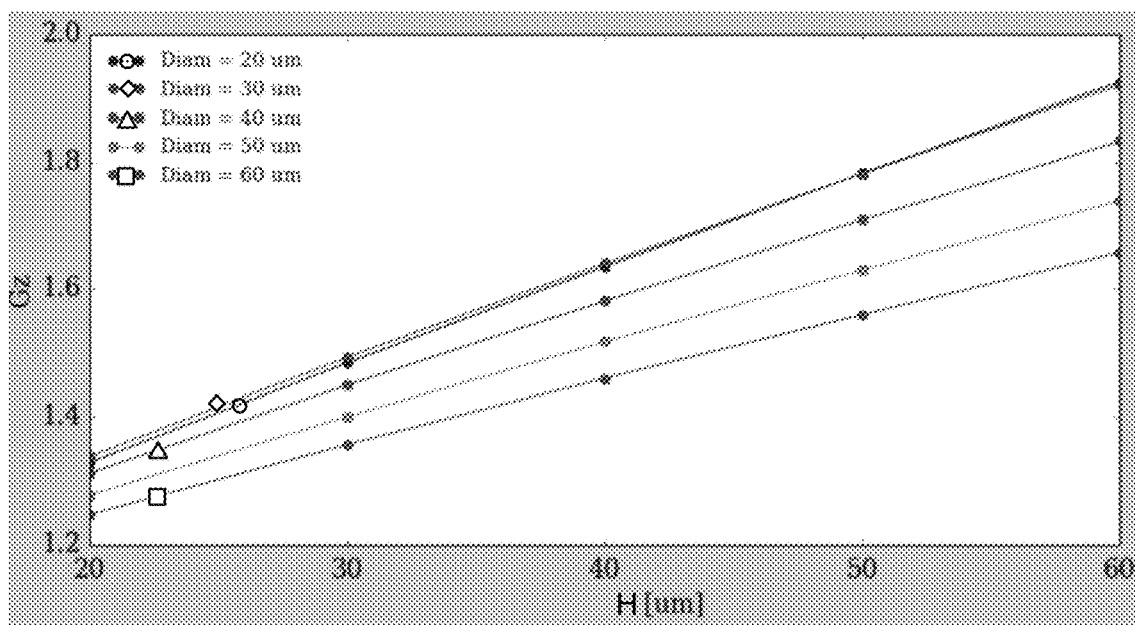
FIG 5(b)

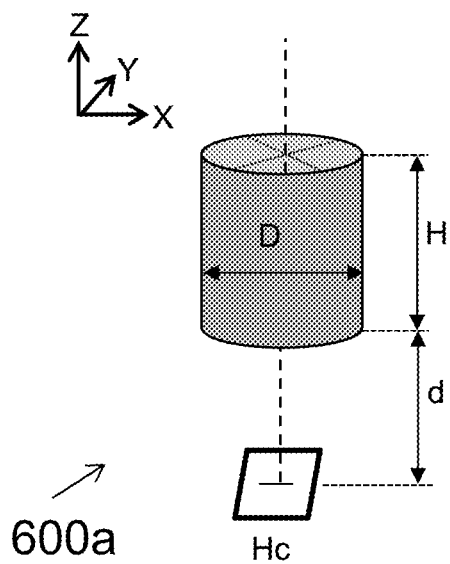 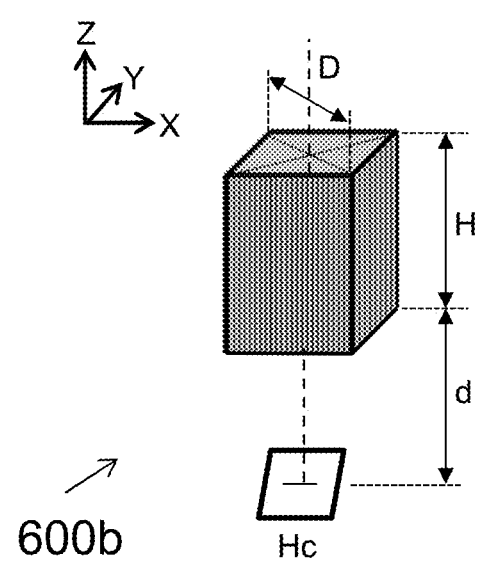
FIG 6(a)  FIG 6(b)
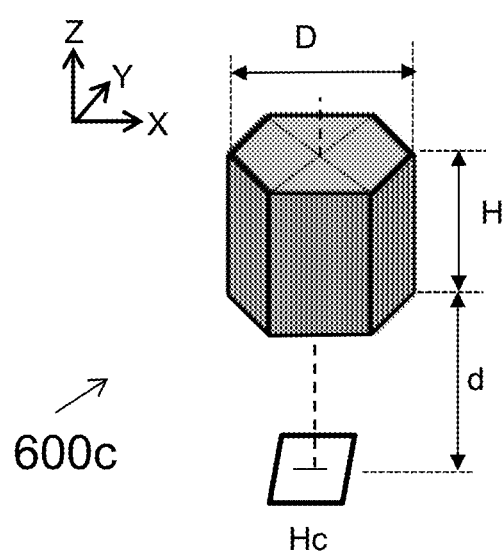 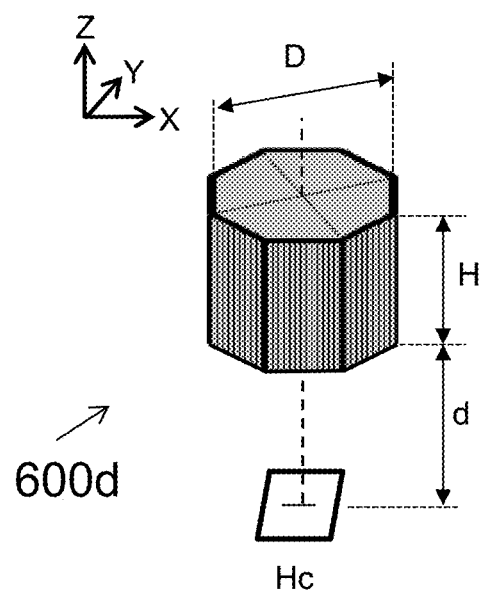
FIG 6(c)  FIG 6(d)

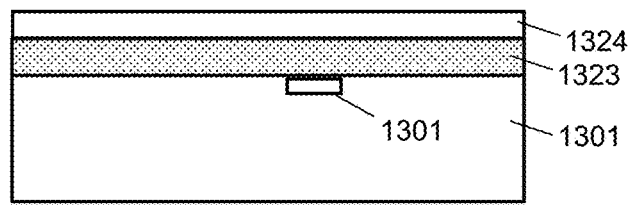
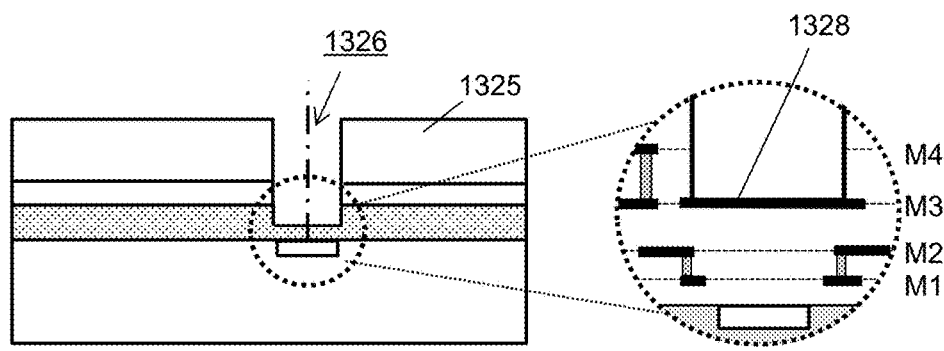
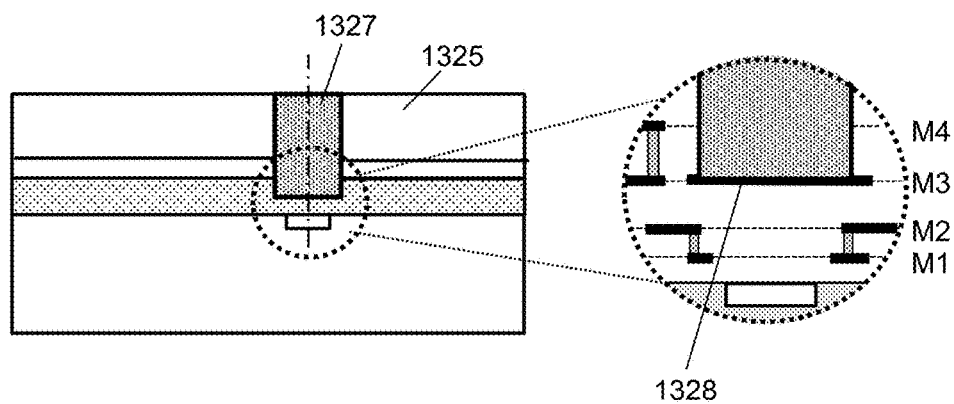
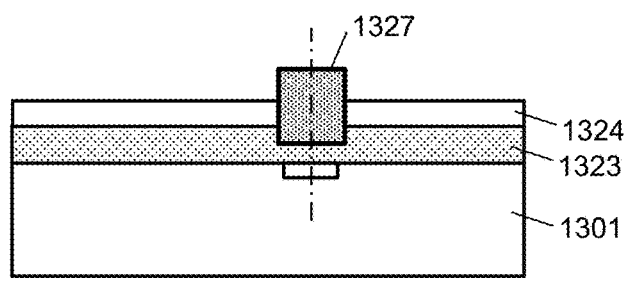
FIG 13

FIG. 14(a)
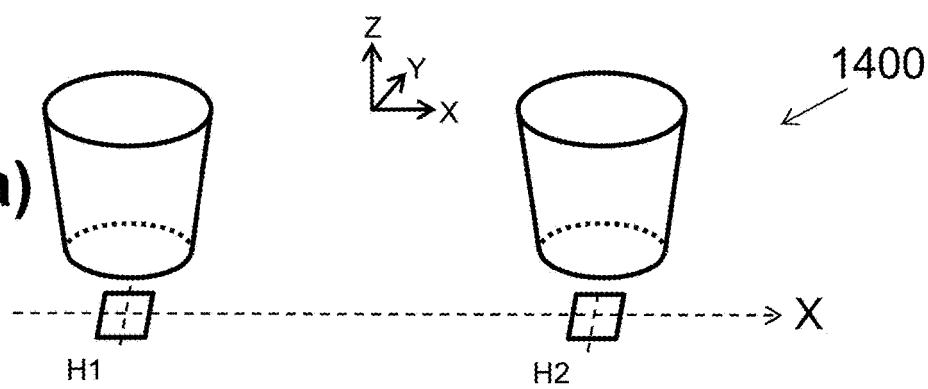
FIG. 14(b)
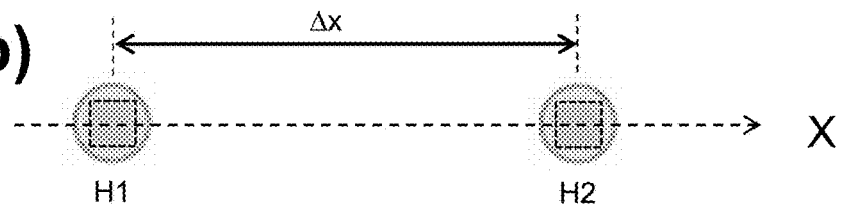
FIG 14

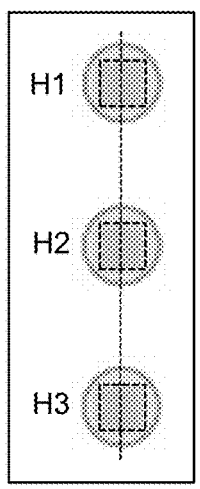
FIG. 15(a)
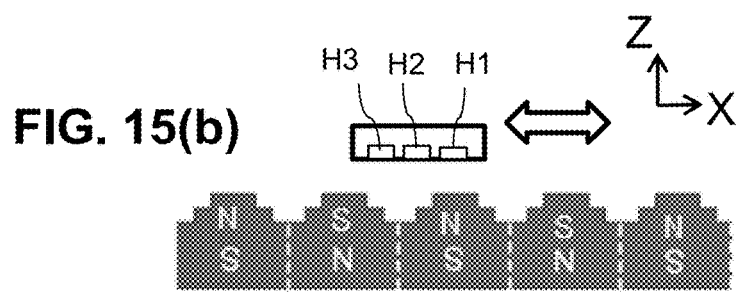
FIG. 15(b)
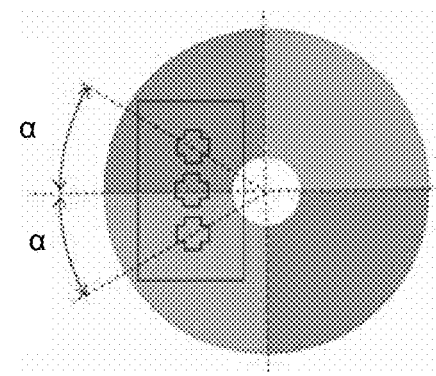
FIG. 15(c)
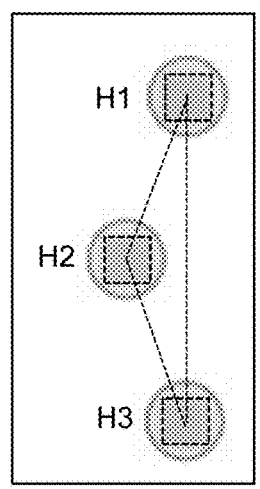
FIG. 15(d)
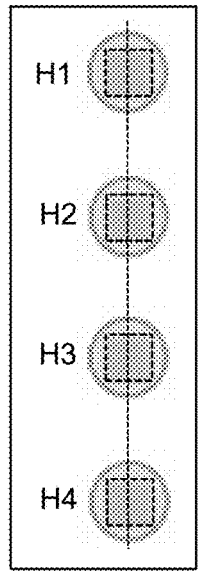
FIG. 15(e)
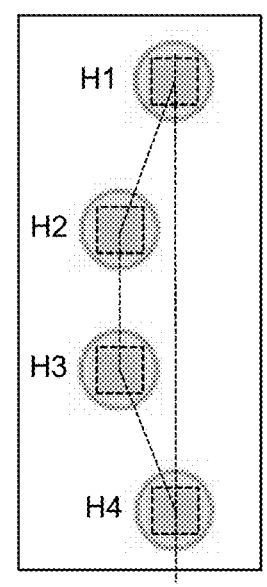
FIG. 15(f)
FIG 15

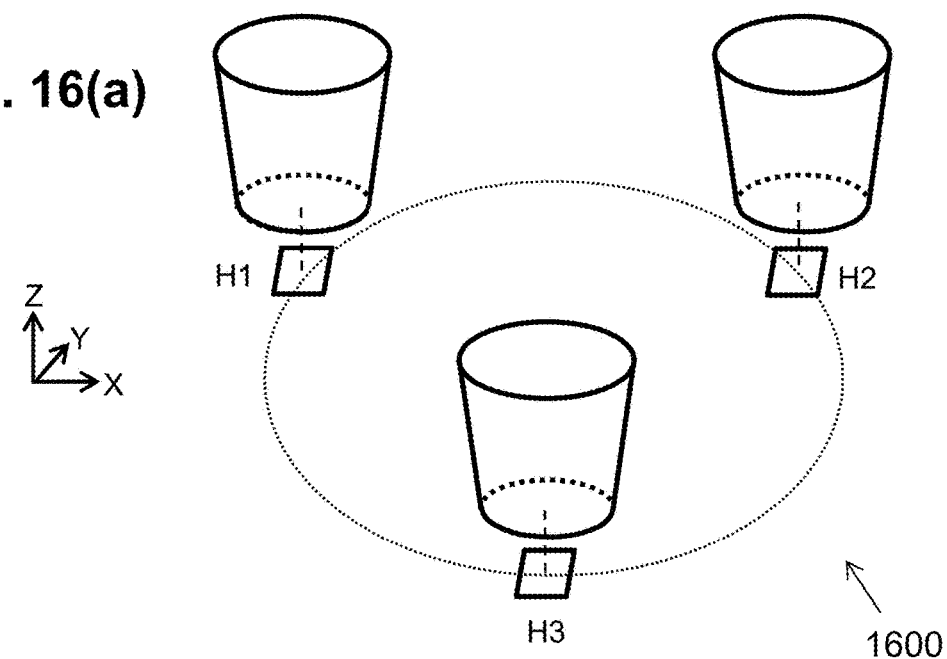
FIG. 16(a)
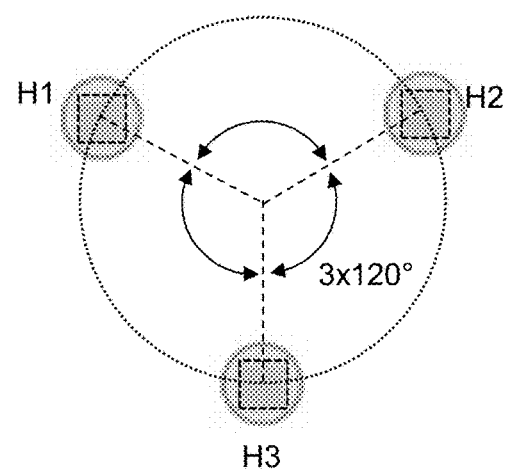
FIG. 16(b)
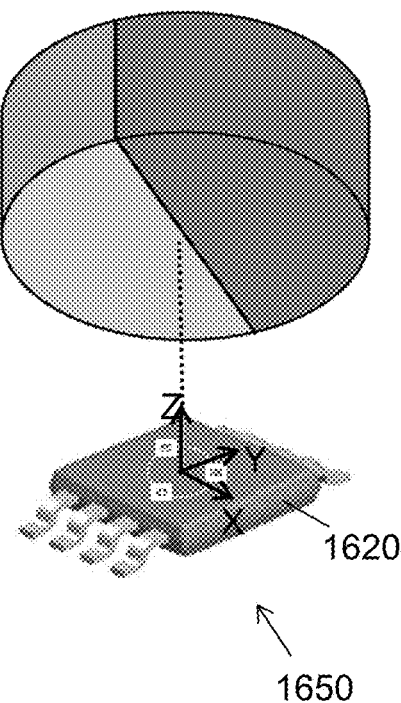
FIG. 16(c)
FIG 16

FIG. 17(a)
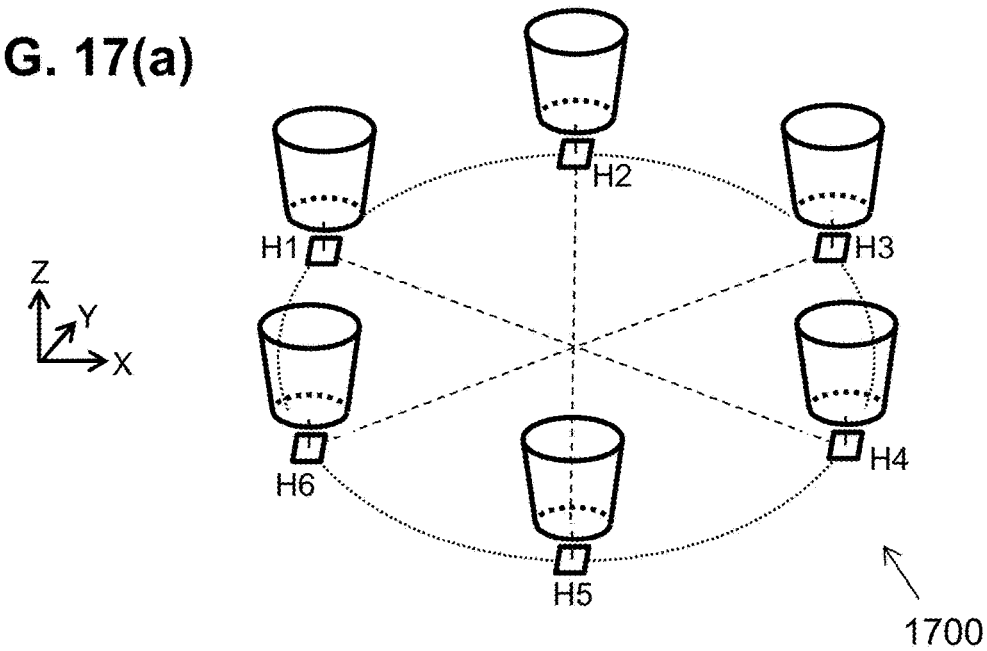
FIG. 17(b)
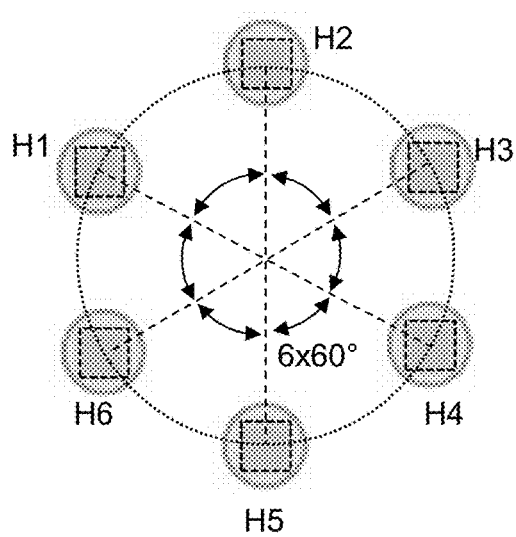
FIG. 17(c)
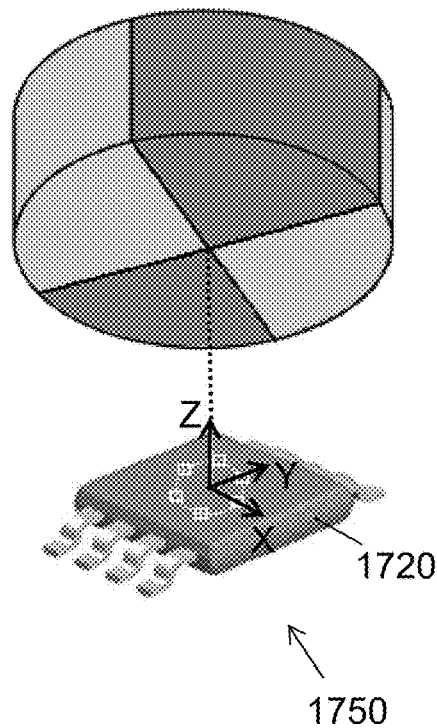
FIG 17

MAGNETIC SENSOR DEVICE

FIELD OF THE INVENTION

The present invention relates in general to the field of magnetic sensor devices, such as for example position sensor devices, current sensor devices, proximity sensor devices, and the like. The present invention also relates to a method of producing such a device.

BACKGROUND OF THE INVENTION

Magnetic sensor devices comprising a semiconductor substrate and at least one horizontal Hall element, are known in the art. They are used for example in linear position sensor devices, angular position sensor devices, current sensor devices, presence detectors, proximity detectors, etc.

It is well known that a horizontal Hall element can be used to measure a magnetic field component (Bz) oriented perpendicular to a semiconductor substrate, whereas vertical Hall elements and magneto-resistive elements can measure a magnetic field component (Bx, By) parallel to the semiconductor substrate.

A linear position sensor system, or an angular position sensor system typically comprises a position sensor device and a magnetic source, e.g. a permanent magnet.

A current sensor system typically comprises a current sensor device and an electrical conductor, such as an integrated conductor or an external conductor, e.g. a bus bar.

A proximity sensor system typically comprises a sensor device and a conductive target, which is movable relative to the sensor device.

Many variants of magnetic sensor systems exist, addressing one or more of the following requirements: using a simple or cheap magnetic structure, using a simple or cheap sensor device, being able to measure over a relatively large range, being able to measure with great accuracy, requiring only simple arithmetic, being able to measure at high speed, being highly robust against positioning errors, being highly robust against an external disturbance field, providing redundancy, being able to detect an error, being able to detect and correct an error, having a good signal-to-noise ratio (SNR), etc. Often two or more of these requirements conflict with each other, hence a trade-off needs to be made.

There is always room for improvements or alternatives.

SUMMARY OF THE INVENTION

It is an object of embodiments of the present invention to provide an integrated sensor device (e.g. a semiconductor wafer, or a semiconductor die, or a packaged device comprising at least one semiconductor die, also referred to as "chip") capable of measuring a physical quantity (e.g. linear position, angular position, current amplitude, proximity indication, etc.) related to a magnetic field.

It is an object of embodiments of the present invention to provide an integrated sensor device comprising a semiconductor substrate, wherein the physical quantity (e.g. linear position, angular position, current amplitude, proximity indicator, etc.) is measured with improved accuracy.

It is an object of embodiments of the present invention to provide an integrated sensor device comprising a semiconductor substrate, wherein the physical quantity is measured with an improved signal-to-noise ratio (SNR).

It is an object of embodiments of the present invention to provide an integrated sensor device comprising a semiconductor substrate, wherein the physical quantity is measured with an improved signal-to-noise ratio (SNR), without increasing the size of the semiconductor substrate and/or without increasing power consumption.

It is an object of embodiments of the present invention to provide an integrated sensor device comprising a semiconductor substrate having a reduced size, while maintaining or even improving the accuracy of the measurement of the physical quantity (e.g. linear position, angular position, current amplitude, proximity indication, etc.).

It is an object of embodiments of the present invention to provide an angular position sensor device having an improved accuracy and/or a reduced size of the semiconductor substrate.

It is an object of particular embodiments of the present invention to provide an angular position sensor device which is more compact, and which has an improved accuracy, and which is highly insensitive to an external disturbance field, and which has an angular range of 360°.

It is an object of embodiments of the present invention to provide a linear position sensor device having an improved accuracy and/or a reduced size of the semiconductor substrate.

It is an object of particular embodiments of the present invention to provide a linear position sensor device which is more compact, and which has an improved accuracy, and which is highly insensitive to an external disturbance field.

It is also an object of embodiments of the present invention to provide a method of making such a sensor device.

It is an object of embodiments of the present invention to provide such a magnetic sensor structure, or such a position sensor device that is suitable for use in an industrial and/or automotive environment.

These and other objectives are accomplished by embodiments of the present invention.

According to a first aspect, the present invention provides an integrated sensor device comprising: a semiconductor substrate comprising a first horizontal Hall element; a first integrated magnetic flux concentrator located above said first horizontal Hall element; wherein the first magnetic flux concentrator has a shape with a geometric center which is aligned with a geometric centre of the horizontal Hall element; and wherein the shape has a height in a direction perpendicular to the semiconductor substrate, and has a largest transversal dimension in a direction parallel to the semiconductor substrate; and wherein the height of the magnetic flux concentrator is at least 30 µm, and/or wherein a ratio of the height and said largest transversal dimension is at least 25%.

Or expressed mathematically, wherein one or both of the following conditions are satisfied: (i) H≥30 µm; (ii) ratio=(H/D)≥25%. The largest transversal dimension may be a diameter, or a largest diagonal.

It is an advantage of such a sensor device that the integrated magnetic flux concentrator (iMFC) is aligned with the horizontal Hall element, in the sense that a centre of the horizontal Hall element is substantially located on said axis, because the magnetic flux concentrator provides passive signal amplification (by a value larger than 100%) to magnetic field lines oriented perpendicular to the semiconductor substrate (the so called Bz component).

It is an advantage of such a sensor device that the magnetic field component oriented perpendicular to the substrate can be measured more accurately (e.g. due to a higher signal-to-noise ratio).

It is an advantage that the sensor device comprises an integrated magnetic flux concentrator (iMFC), as opposed to an external magnetic flux concentrator, because this allows (i) to embed said magnetic flux concentrator into the integrated device (e.g. chip package), and allows (ii) to accurately align the iMFC to the horizontal Hall element.

While the specific shape or geometry of the iMFC is not critical for the invention to work (e.g. cylindrical or conical or prism or mushroom or the like), the relative dimensions of that shape, e.g. the ratio of the "height" versus the "diameter" of that shape, has an important impact on the performance of the sensor device.

In an embodiment, the shape of the integrated magnetic flux concentrator is an overall cylindrical shape, or an overall conical shape, or an overall truncated conical shape, or a rotation symmetric shape, or a circular symmetric shape about a longitudinal axis, or has an overall prism shape with a regular polygonal cross-section, e.g. a hexagonal prism, or has an overall mushroom shape, or comprises a mainly cylindrical portion, or comprises a mainly conical portion, or comprises a mainly truncated conical portion.

It is noted that the upright wall(s) of the Magnetic Field Concentrator may not be exactly perpendicular to the semiconductor substrate but may be inclined with respect to an orthogonal orientation. The inclination angle may deviate from an ordinal orientation by an angle in the range from about 1° to about 25°.

In an embodiment, the conical shape or truncated conical shape or conical portion or truncated conical portion is tapering towards the horizontal Hall element.

In an embodiment, the integrated magnetic flux concentrator has a shape with a substantially planar bottom surface parallel to the semiconductor substrate.

In an embodiment, the integrated magnetic flux concentrator has a shape with a substantially planar top surface parallel to the semiconductor substrate.

In an embodiment, the height is a value in the range from 30 μm to 500 μm, or from 30 μm to 250 μm, or from 30 μm to 125 μm, or from 30 μm to 80 μm.

In an embodiment, the shape has a height (H) in a direction perpendicular to the semiconductor substrate in the range from 20 to 60 μm.

In an embodiment, the integrated magnetic flux concentrator (iMFC) has a shape with a substantially circular cross section in a plane parallel to the semiconductor substrate. Preferably the circular cross section located halfway between the bottom surface and the top surface has a diameter (D) in the range from 15 to 40 μm, or from 20 to 35 μm.

In an embodiment, the iMFC has a shape with a height extending in a direction perpendicular to the semiconductor substrate, and a diameter or largest diagonal extending in a direction parallel to the semiconductor substrate, and a ratio R of the height and said diameter or diagonal (R=H/D) is larger than 30%, or larger than 40%, or larger than 50%, or larger than 60%, or larger than 70%, or larger than 80%, or larger than 90%, or larger than 100%, or larger than 105%, or larger than 110%. It is noted that a classical integrated IMC in the form of a circular disc typically has a height of about 23 μm and a diameter of about 190 μm, thus has a ratio R=H/D of about 12%.

In a preferred embodiment, the shape of the iMFC has a height in the range from 20 to 60 μm and has a diameter in the range from 15 to 40 μm.

In an embodiment, a cross-section of the shape of the integrated magnetic flux concentrator in a plane parallel to the semiconductor substrate has a diameter or a largest diagonal in the range from 15 to 40 μm, or from 15 to 35 μm, or from 16 to 34 μm, or from 17 to 33 μm, or from 18 to 32 μm, or from 19 to 31 μm, or from 20 to 30 μm.

It was surprisingly found that a maximum gain Gz is obtained for shapes having an overall circular cross-section with a diameter of about 15 to 35 microns, or for shapes having a substantially polygonal cross section with a largest diagonal of about 15 to 35 micron.

In an embodiment, an orthogonal projection of the horizontal Hall element (Hc) onto the substrate is located completely inside the periphery of an orthogonal projection of the bottom surface of the integrated magnetic flux concentrator onto said substrate.

In an embodiment, an orthogonal projection of the bottom surface of the integrated magnetic flux concentrator onto the substrate is located completely inside the periphery of an orthogonal projection of the horizontal Hall element (Hc) onto said substrate.

In an embodiment, a periphery of an orthogonal projection of the horizontal Hall element (Hc) onto the substrate intersects a periphery of an orthogonal projection of the bottom surface of the integrated magnetic flux concentrator onto said substrate.

In an embodiment, the horizontal Hall element has a first area (A1), and the bottom surface of the integrated magnetic flux concentrator (911) has a second area (A2); and the ratio of the first area (A1) and the second area (A2) is a value in the range from 50% to 200%.

In an embodiment, the ratio A1/A2 is a value in the range from 80% to 120%, or from 90% to 110%, e.g. equal to about 100%.

In an embodiment, the ratio A1/A2 is smaller than 95, or smaller than 90%, or smaller than 85%, or smaller than 80%, or smaller than 75%, or smaller than 70%, or smaller than 65%, or smaller than 60%, or smaller than 55%, e.g. equal to about 50%

In an embodiment, the ratio A1/A2 is larger than 105%, or larger than 110%, or larger than 120%, or larger than 130%, or larger than 140%, or larger than 150%, or larger than 160%, or larger than 170%, or larger than 180%, or larger than 190%, e.g. equal to about 200%.

It is an advantage of embodiments wherein the area of the Horizontal Hall element is only a fraction of the area of the iMFC, because this allows magnetic flux lines which were not substantially oriented vertically to leave the iMFC without passing through the surface of the Horizontal Hall element, on other words, because this reduces the leakage or cross talk from a Bx field or a By field to be falsely measured as a Bz field.

It is an advantage of embodiments wherein the area of the Horizontal Hall element is substantially equal to the area of the iMFC, because this provides for a relatively large signal.

In an embodiment, the sensor device is a current sensor device.

In an embodiment, the sensor device is a position sensor device.

It is an advantage of such a position sensor device that a magnetic field component oriented perpendicular to the substrate can be measured more accurately (e.g. due to a higher signal-to-noise ratio), and as a consequence, that the current or the position (e.g. linear position or angular position) derived therefrom can also be determined more accurately.

In an embodiment, the sensor device is linear position sensor device.

In an embodiment, the sensor device is an angular position sensor device.

In an embodiment, a distance between the horizontal Hall element and the integrated magnetic flux concentrator is a value in the range from 1 to 20 µm, or from 1 to 15 µm, or from 1 to 12 µm, or from 1 to 10 µm.

In an embodiment, the semiconductor substrate comprises an interconnection stack comprising at least four metal layers separated by a plurality of insulation layers; and wherein at least a portion of the integrated magnetic flux concentrator is situated inside the interconnection stack.

In an embodiment, a bottom of the integrated magnetic flux concentrator extends to the fourth metal layer (M4), distal from the active surface of the substrate in which the horizontal Hall element is implemented. In this case, the distance between the Hall plate and the iMFC may be a value in the range from about 8 to about 12 µm, e.g. equal to about 10 µm.

In an embodiment, a bottom of the integrated magnetic flux concentrator extends to the third metal layer (M3). In this case, the distance between the Hall plate and the iMFC may be a value in the range from about 5 to about 9 µm, equal to about 7 µm.

In an embodiment, a bottom of the integrated magnetic flux concentrator extends to the second metal layer (M2) i.e. the second closest to the active surface in which the Horizontal Hall element is implemented. In this case, the distance between the Hall plate and the iMFC may be a value in the range from about 2 to about 6 µm, equal to about 4 µm.

In an embodiment, a bottom of the integrated magnetic flux concentrator extends to the first metal layer (M1), i.e. the metal layer closest to the active surface in which the Horizontal Hall element (Hc) is implemented. In this case, the distance between the Hall plate and the iMFC may be a value in the range from about 0.5 to about 2.5 µm, equal to about 1 µm or equal to about 2 µm.

It is an advantage of at least partially implementing the iMFC "in the interconnection stack" because this allows the distance between the Hall element and the iMFC to be decreased, and the passive amplification gain Gz to be increased (for a iMFC with a given size and shape), without having to adjust the dimensions of the interconnection stack. Or stated in other words, by locating the iMFC closer to the horizontal Hall element, the dimensions of the iMFC can be decreased for a given passive amplification gain factor Gz. This may have a major impact on the layout (e.g. smaller die-size) and/or on process cost (e.g. iMFC with reduced thickness requires less time to produce).

Thus, this technique allows to build a sensor device with an improved accuracy or with a smaller die size, or both.

In an embodiment, the semiconductor substrate has an active surface comprising said horizontal Hall element, and a passive surface opposite the active surface; and the integrated magnetic flux concentrator is located on the side of the active surface.

In an embodiment, the semiconductor substrate (has an active surface comprising said horizontal Hall element, and a passive surface opposite the active surface; and the integrated magnetic flux concentrator is located on the side of the passive surface.

In an embodiment, the integrated sensor device further comprises a second magnetic flux concentrator having a ring shape with an inner diameter larger than an outer diameter of the first magnetic flux concentrator and being arranged concentrically with the first magnetic flux concentrator; and wherein the semiconductor substrate further comprises at least a second and a third horizontal Hall element arranged adjacent a periphery of the second integrated magnetic flux concentrator.

In an embodiment, the integrated sensor device further comprises a plurality of second integrated magnetic flux concentrators each having an elongated shape and being radially oriented with respect to the first horizontal Hall element; and wherein the semiconductor substrate further comprises a plurality of further horizontal Hall elements arranged adjacent a periphery of a corresponding second integrated magnetic flux concentrator.

It is an advantage that the first horizontal Hall element, which is located under the first iMFC, is situated between (e.g. substantially in the middle between) the second and third or further horizontal Hall elements, because it will experience substantially the same temperature, thus will suffer less from temperature drift.

In an embodiment, the semiconductor substrate further comprises a second magnetic flux concentrator having a ring shape or a disk shape and further comprises at least a second and a third horizontal Hall element arranged adjacent a periphery of the second integrated magnetic flux concentrator.

In an embodiment, the semiconductor substrate further comprises a plurality of second magnetic flux concentrators having elongated shapes, and further comprises a plurality of horizontal Hall elements, each arranged adjacent a periphery of a respective elongated shape.

In an embodiment, the integrated sensor device further comprises a second semiconductor substrate; wherein the second semiconductor substrate comprises a second magnetic flux concentrator having a ring shape or a disk shape and further comprises at least a second and a third horizontal Hall element arranged adjacent a periphery of the second integrated magnetic flux concentrator; or wherein the second semiconductor substrate comprises a plurality of second magnetic flux concentrators having elongated shapes, and further comprises a plurality of horizontal Hall elements, each arranged adjacent a periphery of a respective elongated shape; and wherein the first semiconductor substrate and the second semiconductor substrate are stacked on top of each other or are located next to each other, and are interconnected by means of bond wires.

According to a second aspect, the present invention also provides a method of producing an integrated sensor device, comprising the steps of: a) providing a semiconductor substrate comprising a first horizontal Hall element; b) providing a photoresist layer on top of the semiconductor substrate; c) making an opening or a cavity in a top layer of the semiconductor substrate, such that a center of the opening or the cavity is substantially aligned with a center of the first horizontal Hall element; d) providing (e.g. depositing) a soft magnetic material inside the opening or cavity, thereby making a first magnetic flux concentrator having an shape along an axis perpendicular to the semiconductor substrate and passing through said first horizontal Hall element.

With "height direction" is meant in a direction perpendicular to the semiconductor substrate.

With "lateral dimension" is meant in a direction perpendicular to the height direction, thus a dimension parallel to the semiconductor substrate, e.g. a diameter or a diagonal.

The steps b) to d) are preferably performed such that a height H of the iMFC, and a largest diameter or largest diagonal satisfy at least one of the following conditions: (i) H≥30 µm, (ii) (H/D)≥25%

In an embodiment, step a) comprises: providing a semiconductor substrate comprising a first horizontal Hall element, and comprising an interconnection stack comprising at least four metal layers separated by a plurality of insulation layers; and wherein step b) comprises: removing at least a portion of at least one of said insulation layers.

The interconnection stack may be designed such that no metal interconnections are routed through the space that will be occupied by the iMFC.

While not absolutely required, one of the metal layers may comprise a metallic portion serving as an etch stop. This metallic portion may be located in any of the four metal layers of the interconnection stack.

According to another aspect, the present invention also provides a current sensor system comprising a sensor device according to the first aspect, and an electrical conductor.

According to another aspect, the present invention also provides a linear position sensor system comprising a sensor device according to the first aspect, and a magnetic source having an elongated shape and a plurality of at least four poles.

According to another aspect, the present invention also provides an angular position sensor system comprising a sensor device according to the first aspect, and a magnetic source. The magnetic source may be a two-pole magnet, or a four-pole magnet, or a magnet with more than four poles.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 1(a) to FIG. 1(c), shows an angular position sensor system known in the art.

FIG. 2, including FIG. 2(a) to FIG. 2(c)

FIG. 5(a) and FIG. 5(b) show the magnetic gain Gz in the Z-direction, provided by a sensor structure similar to that of FIG. 2(c) or FIG. 4(a) to FIG. 4(c), but having a cylindrical shape, obtained by simulation. In FIG. 5(a) the magnetic gain Gz is shown as a function of the diameter of the magnetic flux concentrator for various heights. In FIG. 5(b) the magnetic gain Gz is shown as a function of the height of the magnetic flux concentrator for various diameters.

FIG. 6(a) to FIG. 6(d) show variants of the magnetic sensor structure of FIG. 2(c), and FIG. 4(a) to FIG. 4(c). In FIG. 6(a) the iMFC has a cylindrical shape. In FIG. 6(b) to FIG. 6(d) the iMFC is a prism with a square cross section, a hexagonal cross section, and an octagonal cross section, respectively.

as shown in FIG. 2(c) or FIG. 4(a) to FIG. 4(c).

as shown in FIG. 2(c) or FIG. 4(a) to FIG. 4(c).

FIG. 12(a) to FIG. 12(d), shows intermediate semiconductor structures, as can be obtained by performing the steps of the method of FIG. 11.

FIG. 13, including FIG. 13(a) to FIG. 13(d), shows intermediate semiconductor structures, as can be obtained by performing a variant of the method of FIG. 11, in which the iMFC is implemented at least partially inside the interconnection stack.

FIG. 14, including FIG. 14(a) and FIG. 14(b), shows another embodiment of a magnetic sensor structure according to the present invention, containing two structures as shown in FIG. 2(c), spaced apart over a distance Δx along an axis, in perspective view and in top view respectively.

FIG. 15, including FIG. 15(a) to FIG. 15(f), shows another embodiment of a magnetic sensor structure according to the present invention, containing three structures as shown in FIG. 2(c), spaced apart equidistantly along an axis.

FIG. 15(b) is a schematic representation of a linear position sensor containing a multi-pole magnetic structure, and a magnetic sensor structure as shown in FIG. 15(a).

FIG. 15(c) is a schematic representation of an angular position sensor containing a four-pole ring magnet, and a magnetic sensor structure as shown in FIG. 15(a), located off-axis.

FIG. 15(d) shows a variant of the magnetic sensor structure of FIG. 15(a), where the sensor elements are located on a triangle, as can be used in a linear or angular position sensor system.

FIG. 15(e) shows a variant of the magnetic sensor structure of FIG. 15(a), containing four sensor elements, equidistantly spaced along an axis, as can be used in a linear or angular position sensor system.

FIG. 15(f) shows a variant of the magnetic sensor structure of FIG. 15(a), containing four sensor elements located on a trapezium, as can be used in a linear or angular position sensor system.

FIG. 16, including FIG. 16(a) to FIG. 16(c), FIG. 16(a) and FIG. 16(b) show a variant of the magnetic sensor structure of FIG. 2(a) in perspective view and in top view, containing three sensor structures as shown in FIG. 2(c), located on a virtual circle, and angularly spaced by multiples of 120°.

FIG. 16(c) shows an angular sensor system comprising a two-pole magnet, and a magnetic sensor structure as shown in FIG. 16(a) and FIG. 16(b).

FIG. 17, including FIG. 17(a) to FIG. 17(c), FIG. 17(a) and FIG. 17(b) show a variant of the magnetic sensor structure of FIG. 2(a) and FIG. 16(a) in perspective view and in top view, containing six sensor structures as shown in FIG. 2(c), located on a virtual circle, and angularly spaced by multiples of 60°.

FIG. 17(c) shows an angular sensor system comprising a four-pole magnet, and a magnetic sensor structure as shown in FIG. 17(a) and FIG. 17(b).

Figure 1:
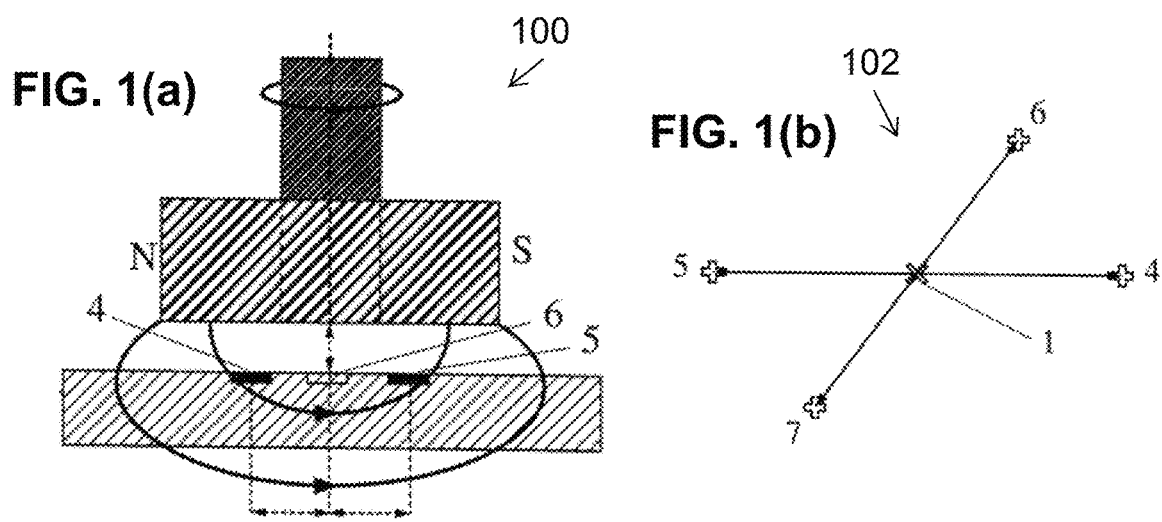
FIG. 1, including

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings, but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In this document, the term "integrated magnetic concentrator" (IMC), and "integrated magnetic flux concentrator" (iMFC) mean the same.

FIG. 1(a) to FIG. 1(c) illustrates an angular position sensor system 100 known from WO9854547A1, incorporated herein by reference in its entirety.

FIG. 1(a) of the present application is a replica of FIG. 1 of the WO-publication and shows a bar magnet which is rotatable relative to a substrate. The substrate comprises four horizontal Hall elements, arranged on a circle.

FIG. 1(b) of the present application is a replica of FIG. 2 of the WO-publication and shows a perspective view on the sensor elements of the sensor device. The sensor device 102 contains four horizontal Hall elements 4, 5, 6, 7 arranged on a circle, configured for providing signals S4, S5, S6, S7 respectively. The sensor elements are angularly spaced apart by multiples of 90°. A first difference signal is calculated as (S7−S6). A second difference signal is calculated as (S5−S4). An angular position of the magnet is calculated using the formula:

$$\theta c = \arctan((S7-S6)/(S5-S4)) \quad [1]$$

where S4 and S5 are located diametrically opposite each other, and S6 and S7 are located diametrically opposite each other. It is pointed out that the priority date of the WO-application dates back to May 1997, which is more than 23 years ago, which is huge, especially in the highly competitive field of electronics, especially electronics for industrial and automotive applications. The arrangement illustrated in FIG. 1(a) to FIG. 1(c) has very advantageous properties, for example, it provides a 360° measurement range, and is substantially insensitive to a (homogenous) external disturbance field. These are highly desirable features in for example motor applications.

A disadvantage of this arrangement, however, is that it cannot be easily scaled down. For example, if the size of the magnet, and the size of the horizontal Hall elements, and the distance between them is reduced, the impact of mechanical tolerances and of process tolerances increases, the sensor signals become very small, the difference signals become very small, the signal-to-noise ratio (SNR) of the signals decreases, and the accuracy of the sensor system decreases.

The inventors were confronted with the question whether it is possible to improve the accuracy of the sensor arrangement as shown in FIG. 1(a) and/or to reduce the size of that sensor arrangement. The distance between the Hall elements of FIG. 1(a) was probably around 2.5 mm at the time of filing the WO-application, so the challenge is whether the distance between the diametrically opposed horizontal Hall elements can be reduced to at most 2.0 mm, or at most 1.8 mm, or at most 1.6 mm, or at most 1.5 mm, or at most 1.4 mm, or at most 1.3 mm, or at most 1.2 mm, or to at most 1.0 mm, or to at most 0.9 mm, or to at most 0.8 mm, or to at most 0.7 mm, or to at most 0.6 mm, or at most 0.5 mm, while still providing an angular position sensor with a decent accuracy (e.g. with an angular error of at most 2.0°, or at most 1.5°, or at most 1.0°, or at most or at most 0.5°).

Figure 2A:
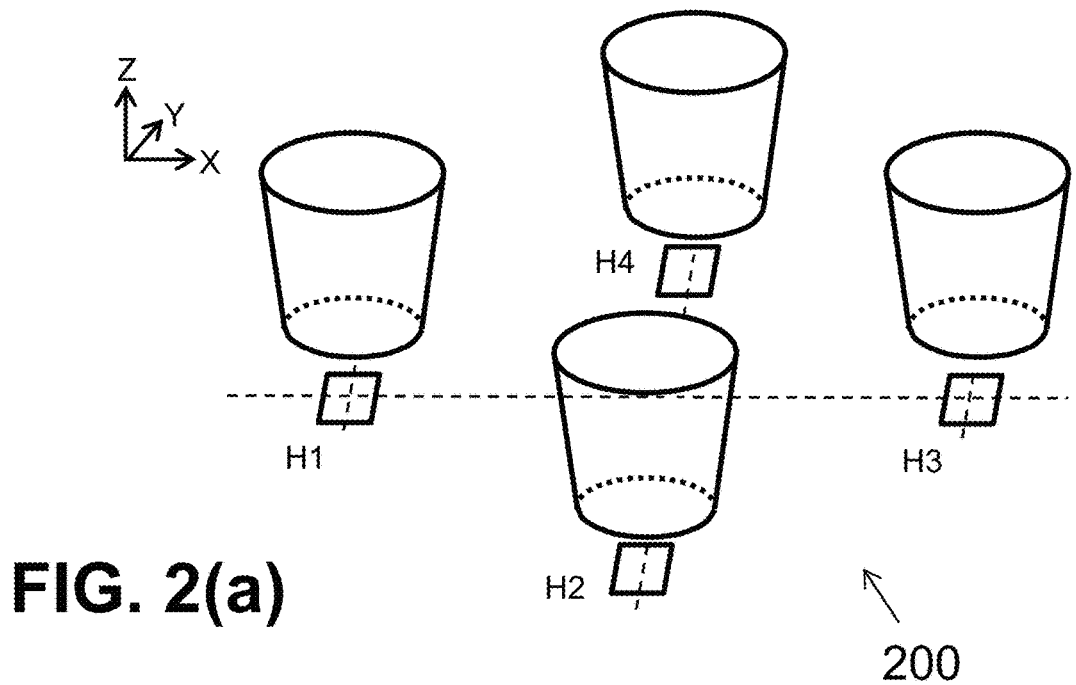
FIG. 2(a) is a schematic representation of a sensor device comprising four sensor structures, each sensor structure comprising a horizontal Hall element and an integrated Magnetic Flux Concentrator (iMFC) aligned to said Hall element, as proposed by the present invention. In the example of FIG. 2, the iMFC has a frusto-conical shape, but the present invention is not limited thereto.

The inventors came to the idea of providing an integrated sensor device with a magnetic sensor structure schematically illustrated in FIG. 2(a), comprising a plurality of horizontal Hall elements H1 to H4, and further comprising a plurality of integrated Magnetic Flux Concentrators iMFC1 to iMFC4, each aligned to a corresponding underlying horizontal Hall element.

This is one of the underlying ideas of the present invention, and was the start of a research project, because they did not know whether this would actually work, whether the performance would be improved, and by how much, and how it could be implemented in a cost-effective manner, e.g. in a CMOS process.

This is not a trivial idea, because (i) existing magnetic sensor structures comprising (an) integrated magnetic flux concentrator(s) are typically used to bend horizontal flux lines into vertical flux lines so that the Bx or By field component can be measured by horizontal Hall elements; and (ii) in existing solutions, the horizontal Hall elements are located at a periphery of the IMFC, not in the center thereof; and (iii) known integrated flux concentrators typically have a disk shape with a relatively large diameter of about 200 μm and a height (or thickness) of about 20 to 25 μm (thus having an aspect ratio of about 10/1). It is not realistic to build a similar iMFC structure extending in the height direction of the substrate. And it is also not realistic to reduce the size by almost a factor of 10 and expect the same results. In short, the inventors did not know what could be expected, or more specifically, what the performance would be of an iMFC of a moderate height and/or with a moderate height/diameter ratio, and/or whether it would be possible to implement such an iMFC in an integrated solution, since CMOS and more generally microfabrication technologies are not very well suited for building "vertical structures" at micro-scale.

The inventors made computer models of sensor arrangements comprising a horizontal Hall element and a Magnetic Flux Concentrator having various shapes, and comprising or consisting of a soft magnetic material, and performed simulations to verify how this structure would react to a magnetic field in various directions. The computer simulations were performed using a software simulation program called "COMSOL Multiphysics®", which is commercially available at the time of writing this application, but other simulation tools may also be used.

Figure 2B:
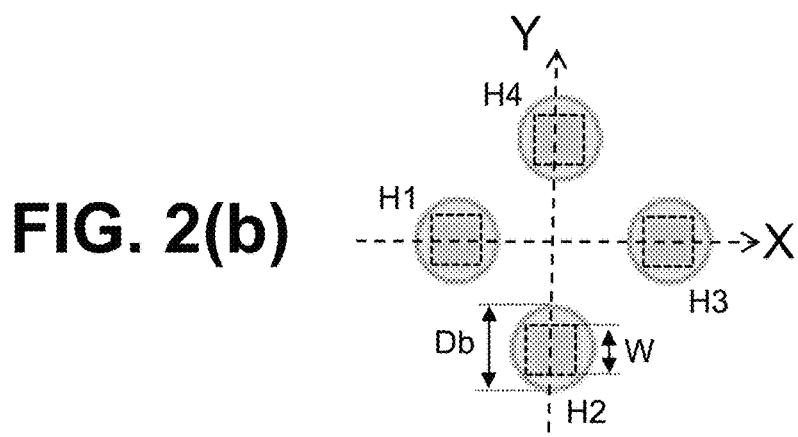
FIG. 2(b) shows an orthogonal projection of the bottom surfaces of the flux concentrators on the semiconductor substrate.

FIG. 2(b) shows an orthogonal projection of the bottom surfaces of the flux concentrators on the semiconductor substrate. In the example shown, the area of the bottom surface of the iMFC is slightly larger than the area of the Horizontal Hall element, but that is not absolutely required for the invention to work, and alternative embodiments wherein the ratio (diagonal/diameter) of the length of the diagonal of the Hall element and the diameter of the circular bottom surface is a value in the range from 50% to 200%, or from 60% to 170%, or from 70% to 140%, or from 80% to 125%, or from 90% to 110%, are also envisioned. In some embodiments, the projected area of the bottom surface of the iMFC is larger than the projected area of the Hall element. In some embodiments, the projected area of the bottom surface of the iMFC is smaller than the projected area of the Hall element. In some embodiments the projected area of the horizontal Hall element is completely contained within the periphery of the projection of the bottom surface of the iMFC. In some embodiments the projected area of the bottom surface of the iMFC is completely contained within the projected area of the horizontal Hall element. In some embodiments, the periphery of the projected area of the bottom surface of the iMFC intersects the periphery of the projected area of the horizontal Hall element. The Hall element may have a substantially square shape.

Figure 2C:
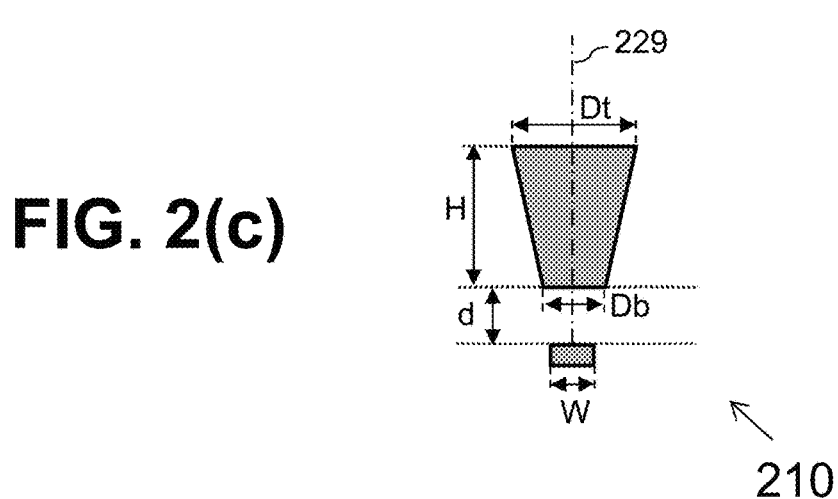
FIG. 2(c) shows a side view of one such sensor structure.

FIG. 2(c) shows a side view of one such magnetic sensor structure, further showing various dimensions, such as: a diameter "Dt" of a top surface of the iMFC, a diameter "Db" of a bottom surface of the iMFC, a height "H" of the iMFC, a distance "d" between the horizontal Hall element and the bottom surface of the iMFC, and a width "W" of the horizontal Hall elements. Envisioned values for Dt, Db, and H are 20 to 80 μm; envisioned values of "d" are 1 to 20 μm; typical values for W are 5 to 50 μm.

Figure 3:
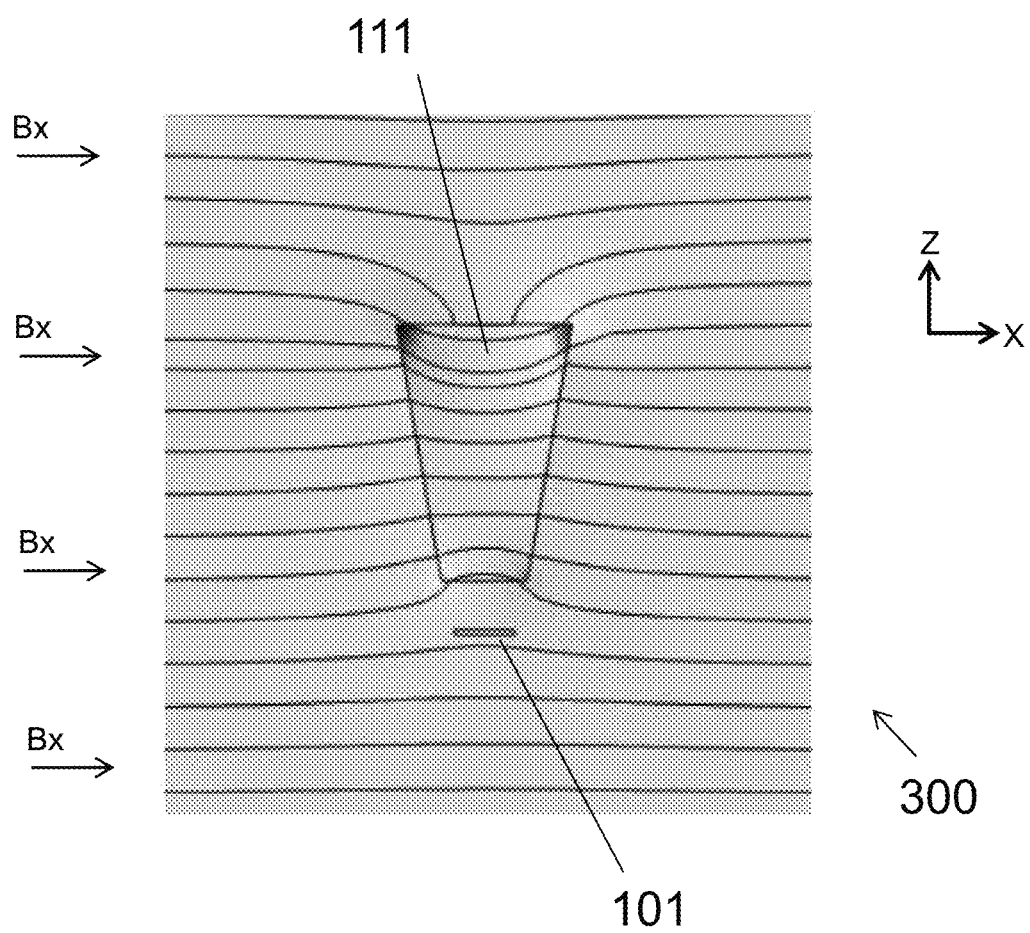
FIG. 3 shows an example of how the field lines of a homogeneous magnetic field oriented in the X-direction parallel to the semiconductor substrate, are deformed by an illustrative embodiment of a sensor structure as shown in FIG. 2(c).

FIG. 3 shows the result of such a simulation, using an iMFC 111 with a frustoconical shape having an axis which is aligned above the center of a horizontal Hall element 101. A bottom surface of the iMFC is located at a distance "d" from the horizontal Hall element. A homogeneous field Bx is applied in the X-direction. The geometric parameters of the simulated arrangement are listed in the following table, but of course the present invention is not limited hereto.

|  | FIG. 3 |
|---|---|
| size Hall element | 15 μm × 15 μm |
| height (H) of iMFC | 60 μm |
| bottom diameter of iMFC | 20 μm |
| angle (λ) of side wall of iMFC | 100° |
| distance between Hall and iMFC | 12 μm |

As can be seen, the magnetic field lines "seen" by the horizontal Hall element 101 are substantially parallel to the horizontal Hall element, and they are substantially symmetric with respect to an imaginary vertical symmetry plane passing through the center (not shown), hence no net signal will be measured by the horizontal Hall element.

Figures 4, 4A, 4B, 4C:
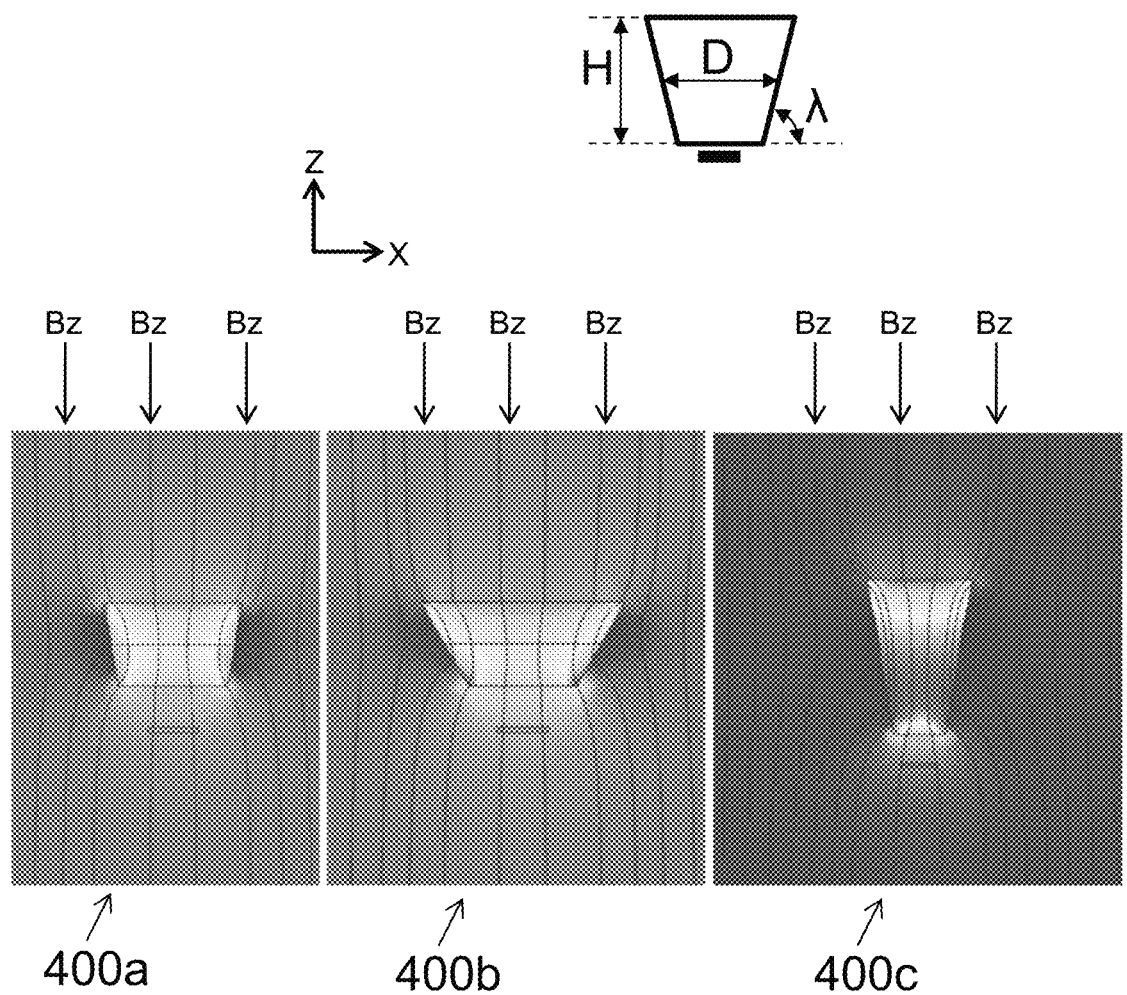
FIG. 4, including
FIG. 4(a) to FIG. 4(c), shows examples of illustrative embodiments of sensor structures as shown in FIG. 2(c), with various aspect ratios, and shows how the field lines of a homogeneous magnetic field oriented in the negative Z-direction, perpendicular to the semiconductor substrate, are deformed by the sensor structure.

FIG. 4(a) to FIG. 4(c) shows grayscale images with simulation results for three magnetic sensor arrangements, each comprising a horizontal Hall element and an integrated Magnetic Flux Concentrator (iMFC) having a substantially frustoconical shape with an axis aligned to the center of the horizontal Hall element, in the presence of a homogeneous magnetic field oriented in the negative Z-direction. The geometrical parameters of these arrangements are listed in the following table:

|  | FIG. 4(a) | FIG. 4(b) | FIG. 4(c) |
|---|---|---|---|
| size Hall element (W × W) | | 15 μm × 15 μm | |
| height (H) of iMFC | 23 μm | 23 μm | 60 μm |
| diameter (D) bottom of iMFC | 30 μm | 30 μm | 20 μm |
| angle (λ) of side wall of iMFC | 80° | 40° | 80° |
| distance d between Hall and IMFC | 12 μm | 12 μm | 12 μm |

As can be seen, the magnetic field lines sensed by the horizontal Hall element are oriented substantially orthogonal to the horizontal Hall element, hence, they can be measured by the horizontal Hall element. The contrast of the grayscale image is an indication of the magnetic field strength and the magnetic field amplification: "bright" means relatively high amplitude, and "dark" means relatively low amplitude, thus bright spots indicate locations with "amplification".

The simulations also show that, the smaller the distance "d" between the Hall element and the bottom surface of the iMFC, the higher the amplification, which will be exploited in the sensor device obtained by the method illustrated in FIG. 13, where the iMFC is partially implemented in the so called "interconnection stack" (sometimes also referred to as "the metal stack").

Since a magnetic field oriented in an arbitrary direction can be decomposed in a component Bx and By parallel to the horizontal Hall element (which will not be sensed), and in a component Bz perpendicular to the horizontal Hall element (which will be sensed), it can be understood from FIG. 3 and FIG. 4(a) to FIG. 4(c) that a magnetic assembly with the "horizontal Hall element and an iMFC on top, which is aligned to the horizontal Hall element" can be used to measure a Bz-field.

Additional simulations were performed, in order to get a better impression of the magnetic field gain. In these simulations, an iMFC made of FeNi and having a cylindrical shape was used, (thus the angle λ, of the side walls is 90°), the diameter (D) of the bottom surface was 30 μm, the distance (d) between the Hall and the iMFC was 12 μm, and the horizontal Hall element had a square shape (W×W) of 15 μm×15 μm.

FIG. 5(a) shows the magnetic gain Gz provided by an iMFC with a cylindrical shape having various diameters, ranging from 20 μm to 60 μm, as a function of the height of the iMFC. As can be seen, for a given diameter, an iMFC with a larger height provides a larger gain Gz. For example, for an iMFC having a diameter of about 30 μm and a height of about 20 μm (curve with square), the gain Gz is equal to about 1.34, which is much higher than expected. As another example, if the height of this iMFC is increased to about 60 μm, the gain Gz is increased to about 1.92 (curve with triangle), which is huge. And also very surprisingly, for any given height in the range from 20 to 60 μm, the gain Gz is maximal for a diameter D of about 20 to about 30 μm.

FIG. 5(b) shows the magnetic gain Gz for an integrated magnetic flux concentrator iMFC with various diameters, as a function of the height H of the iMFC. As can be seen, the gain Gz substantially linearly increases with the height H. As can be seen, for a given height H, the gain Gz increases as the diameter decreases from 60 μm to about 30 μm but remains substantially constant if the diameter further decreases to about 20 μm (the curve with the circle and the curve with the diamond are very close to each other).

As a rule of thumb, for an integrated Magnetic Flux Concentrator (iMFC) having a shape with upright walls) (λ=90° and having a diameter (in case of a cylindrical shape) or a "largest diagonal" (for prisms, see e.g. FIG. 6(a) to FIG. 6(d)) of about 20 to about 30 micron, the gain Gz can be approximated by the following formula:

$$Gz = 1.05 + (0.0145 * H) \quad [2]$$

wherein Gz is the magnetic gain, and H is the height of the iMFC expressed in micron.

As a few examples:
for a cylindrical iMFC with D=20 to 30 micron and H=20 micron, Gz is equal to about 1.34
for a cylindrical iMFC with D=20 to 30 micron and H=23 micron, Gz is equal to about 1.38
for a cylindrical iMFC with D=20 to 30 micron and H=30 micron, Gz is equal to about 1.49
for a cylindrical iMFC with D=20 to 30 micron and H=40 micron, Gz is equal to about 1.63
for a cylindrical iMFC with D=20 to 30 micron and H=50 micron, Gz is equal to about 1.77
for a cylindrical iMFC with D=20 to 30 micron and H=60 micron, Gz is equal to about 1.92.

Surprisingly, a magnetic sensor arrangement with a cylindrical magnetic flux concentrator having a diameter D of only about 20 μm and a height H of only about 20 μm provides a passive amplification by a factor of 1.34, meaning that it yields a signal which is 34% larger as compared to a horizontal Hall element without a magnetic flux concentrator. This is a huge improvement which could not have been predicted.

This insight can be used to build a magnetic sensor structure capable of providing a larger signal amplitude (Bz), and thus a better SNR and a higher accuracy, by adding an iMFC on top of a horizontal Hall element. Additionally or alternatively, the gain Gz provided by the iMFC can be used to decrease the distance "dx" between horizontal Hall elements, e.g. when determining a gradient signal (e.g. dBz/dx and dBz/dy as in the configuration of FIG. 2(a)) or when determining a difference signal between pairs of values (see e.g. FIG. 15), without decreasing the signal-to-noise ratio (SNR) thereof.

For completeness it is noted that, the magnetic gain Gz will typically increase if the distance "d" decreases, and/or if the angle λ, of the side walls is reduced (smaller than 90°). The gain Gz will remain substantially unchanged as long as the diameter D of the iMFC is larger than the diagonal of the Hall plate (W*√2). For smaller diameters of the iMFC, the magnetic gain may decrease. As already mentioned above, the gain Gz for an iMFC having a frustoconical shape with the same height H, will be larger than the values shown in FIG. 5(a) and FIG. 5(b).

While the simulations were performed for FeNi as a soft magnetic material, of course the present invention is not limited thereto, and other soft magnetic materials may also be used, for example amorphous metal alloys, e.g. Fe-based alloys, Ni-based alloys, FeNi-based alloys, Co-based alloys. The alloy may further comprise one or more of: Silicon, Boron, Carbon, Copper.

FIG. 6(a) to FIG. 6(d) show examples of sensor structures comprising a horizontal Hall element, and an integrated magnetic flux concentrator aligned thereto, wherein the iMFC has various shapes. These sensor structures can also be used in embodiments of the present invention, the present invention not being limited hereto. FIG. 6(a) shows a cylindrical shape, FIG. 6(b) shows a prism with a square cross section, FIG. 6(c) shows a prism with a hexagonal cross section, FIG. 6(d) shows a prism with an octagonal cross-section. From these examples, it shall be clear that other prisms with a regular or irregular polygonal cross section can also be used.

In practice, the upright walls may not be perfectly orthogonal to the semiconductor substrate, but that is not required for the invention to work. In fact, it may even be beneficial (in terms of improved gain) to use a structure with walls that are slightly inclined, such that the iMFC tapers towards the horizontal Hall element situated underneath.

The distance "d" between the horizontal Hall element and the integrated Magnetic Flux Concentrator is preferably smaller than 25 µm, or smaller than 20 µm, or smaller than 15 µm, or smaller than 12 µm, or smaller than 9 µm, or smaller than 6 µm, or smaller than 5 µm, or smaller than 4 µm. While the distance "d" is not critical for the invention to work (as long as it is smaller than about 30 µm), the gain Gz provided by the integrated Magnetic Flux Concentrator may slightly decrease as the distance "d" increases.

The present invention also proposes magnetic sensor structures comprising one or more sensor structures as shown in FIG. 2(c) and/or FIG. 4(a) to FIG. 4(c).

Figure 7A:
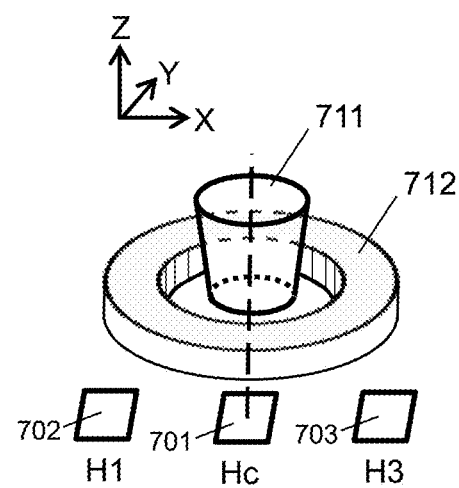
FIG. 7(a) shows a perspective view.
Figure 7B:
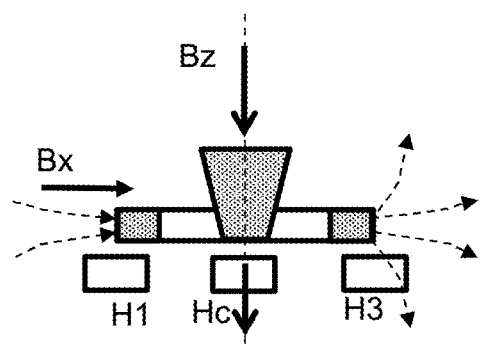
FIG. 7(b) shows a cross sectional view of another embodiment of a magnetic sensor structure proposed by the present invention, capable of measuring two orthogonal components Bx, Bz of a magnetic field. The sensor structure comprises a central horizontal Hall element and a first (e.g. cylindrical) iMFC aligned to the central Hall element, and a second iMFC in the form of a ring, arranged concentrically with the first iMFC, and a pair of horizontal Hall elements located near a periphery of the ring, on opposite sides thereof.

FIG. 7(a) shows a perspective view, and FIG. 7(b) shows a cross-sectional side view of a sensor arrangement 700 comprising a central horizontal Hall element 701, and an integrated magnetic flux concentrator 711 aligned to the central horizontal Hall element 701, as described above. The sensor arrangement 700 further comprises a second integrated magnetic flux concentrator 712 in the form of a ring. The ring 712 has an inner diameter which is larger than the outer diameter of the first magnetic concentrator 711 and is arranged concentrically with the first magnetic flux concentrator 711. Sensor arrangement 700 further comprises a second and a third horizontal Hall element 702, 703 arranged adjacent to an outer periphery of the second magnetic flux concentrator 712, on opposite sides thereof.

In the drawing, the height of the first magnetic concentrator 711 is shown to be larger than the height of the second magnetic concentrator 712, but that is not absolutely required, and in other embodiments, the height of the first magnetic concentrator 711 may be equal to, or lower than the height of the second magnetic concentrator 712.

In a particular embodiment, the first magnetic flux concentrator 711 has a diameter of about 25 µm±10 µm, and the ring 712 has an inner diameter of 40 µm to 120 µm, and an outer diameter of 170 µm to 250 µm, and the height of first magnetic flux concentrator is 20 µm to 60 µm, and the height of the second magnetic flux concentrator 712 is 20 µm to 30 µm.

In a particular embodiment, the height of both the first and the second iMFC are equal, and in the range from 20 µm to 30 µm. This offers the benefit that the two magnetic flux concentrators 711, 712 can be formed at the same time, during the same processing step(s).

FIG. 7(b) shows how a vertical magnetic field Bz can be measured by the first horizontal Hall element Hc, after amplification by the first magnetic concentrator 711, and shows how a substantially horizontal magnetic field Bx can be measured by the horizontal Hall elements H1 and H3, after amplification by the second magnetic concentrator 712.

The measurement of the horizontal magnetic field component Bx using a magnetic flux concentrator in the form of a ring is quite similar to the measurement of the horizontal magnetic field component Bx using a magnetic flux concentrator in the form of disc.

Using the magnetic sensor structure 700, the horizontal magnetic field component Bx can for example be calculated as Bx=A*(H3−H1), wherein A is a predefined constant dependent (inter alia) on characteristics of the second magnetic concentrator 712. The vertical magnetic field component Bz can for example be calculated as Bz=K*Hc, wherein K is a predefined constant dependent (inter alia) on characteristics of the first magnetic concentrator 711, and the relative position of the Horizontal Hall element Hc.

In embodiments of the present invention (not shown), a sensor device (not shown) is provided having two magnetic structures as shown in FIG. 7(a), spaced apart from each other by a distance Δx in the range from 1.0 mm to 2.5 mm, or in the range from 1.5 mm to 2.1 mm, for example equal to about 1.7 mm, or equal to about 1.8 mm, or equal to about 1.9 mm. The first magnetic structure will provide a value Bx1 and Bz1 of the magnetic field at a first location X, and the second magnetic structure will provide a value Bx2 and Bz2 of the magnetic field at a second location X+Δx. The sensor device may be further configured for determining a first magnetic field gradient dBx/dx of the Bx-component along the X direction, and a second magnetic field gradient dBz/dx of the Bz-component along the x-axis, and may be further configured for determining a linear position or an angular position based on these gradients, for example based on the formula:

$$\theta = \operatorname{atan} 2(dBx/dx, dBz/dx) \qquad [3]$$

It is a major advantage of this embodiment that not only the Bx field can be passively amplified, but also the Bz-field can be passively amplified. This may be particularly advantageous in systems where the Bz field is weaker than the Bx field.

Figure 7C:
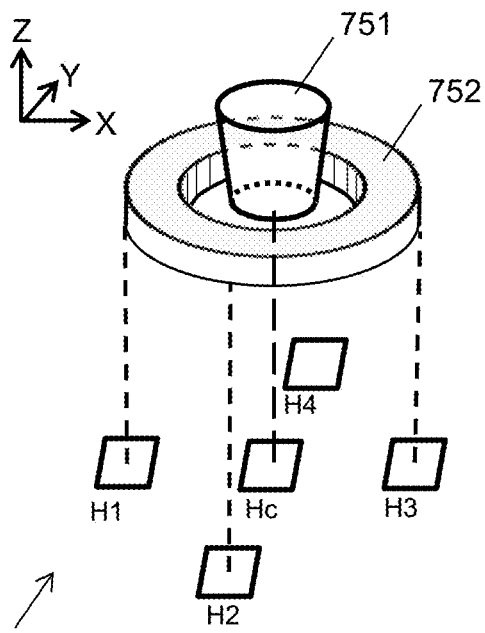
FIG. 7(c) shows a variant of the structure of FIG. 7(a) with five horizontal Hall elements as another embodiment of a magnetic sensor structure proposed by the present invention, capable of measuring three orthogonal magnetic field components Bx, By, Bz.

FIG. 7(c) shows a magnetic sensor structure 750 which is a variant of the structure of FIG. 7(a) having five horizontal Hall elements: one central Hall element Hc located under the first iMFC 751, and four horizontal Hall elements arranged at a periphery of the ring shaped iMFC 752. The structure 750 is capable of measuring three orthogonal magnetic field components Bx, By, Bz at a particular location.

A linear or an angular position sensor device (not shown) may comprise two magnetic sensor structures as shown in FIG. 7(c) spaced apart by a distance Δx along the X-direction. Such a device is capable of measuring (Bx1, By1, Bz1)

at a first sensor location X, and (Bx2, By2, Bz2) at a second sensor location X+Δx and may be configured for calculating three magnetic field gradients dBx/dx, dBy/dx, dBz/dx of the magnetic field components Bx, By, Bz along the X-direction.

Another linear or angular position sensor device (not shown) may comprise at least three, for example four magnetic sensor structures as shown in FIG. 7(c), two of which are spaced apart by a distance Δx along the X-direction, and two of which are spaced apart by a distance Δy in the Y-direction. Such a device is capable of measuring at least three, e.g. four 3D magnetic field vectors (Bx[i], By[i], Bz[i]), and may be configured for calculating six magnetic field gradients, including: dBx/dx, dBy/dx, dBz/dx along the X-direction, and dBx/dy, dBy/dy, dBz/dy in the Y-direction.

Figure 8A:
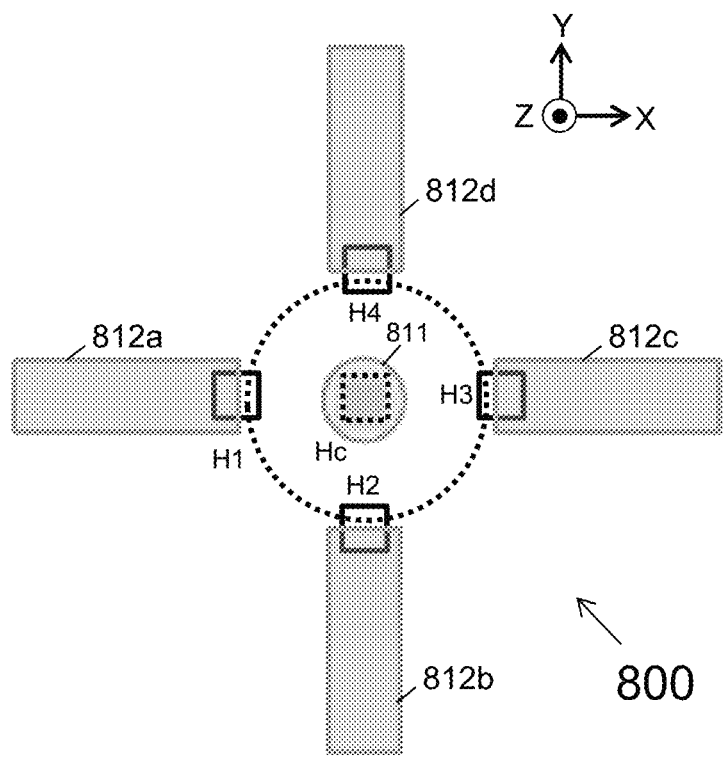
FIG. 8(a) shows a top view of another embodiment of a magnetic sensor structure proposed by the present invention, capable of measuring three orthogonal magnetic field components Bx, By, Bz. The structure comprises a central Hall element and a first IMFC above the central Hall element and aligned thereto, and further comprises four horizontal Hall elements and four elongated IMFC elements, forming a "sun shape".

FIG. 8(a) shows a top view of another magnetic sensor structure 800 proposed by the present invention, capable of measuring three orthogonal magnetic field components Bx, By, Bz. The structure 800 comprises a central Hall element Hc and a first IMFC 811 above the central Hall element and aligned thereto, and further comprises four horizontal Hall elements H1-H4, and four elongated iMFC elements, 812a-812d extending radially. The Hall elements H1-H4 are arranged near a periphery of the corresponding iMFC element. This sensor structure is capable of measuring Bx, By, Bz at a single sensor location. A linear or angular sensor device may comprise at least one, or at least two, or at least three, or at least four such structures for measuring a magnetic field vector (Bx, By, Bz) at multiple locations, and may be adapted for calculating one or more (first order or second order) magnetic field gradients based thereon.

Figure 8B:
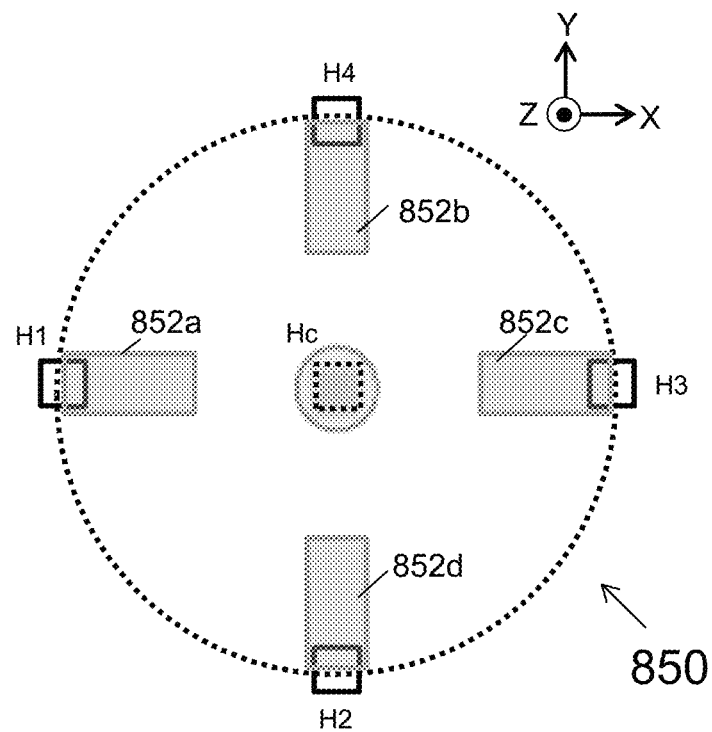
FIG. 8(b) shows a variant of FIG. 8(a) as another embodiment of a magnetic sensor structure proposed by the present invention, capable of measuring three orthogonal magnetic field components Bx, By, Bz, in top view.

FIG. 8(b) shows another magnetic sensor structure 850 in top view, which is a variant of the sensor structure 800 of FIG. 8(a), and which is also capable of measuring three orthogonal magnetic field components Bx, By, Bz at a single sensor location. It also contains four elongated magnetic concentrator elements 852a-852d, and four horizontal Hall elements H1-H4. A sensor device may comprise at least one, or at least two, or at least three, or at least four such structures, and may be adapted for calculating one or more (first order or second order) magnetic field gradients based thereon.

Figure 9A:
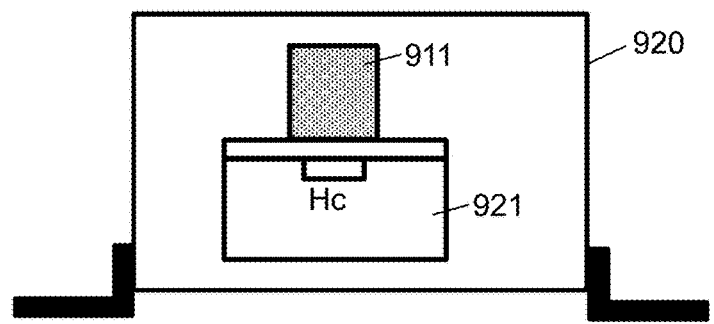
FIG. 9(a) is a schematic representation of a sensor device according to an embodiment of the present invention, comprising a semiconductor substrate with at least one magnetic sensor structure as described above, e.g.

FIG. 9(a) is a schematic representation of a sensor device 920, comprising a semiconductor substrate with at least one magnetic sensor structure as described above.

Figure 9B:
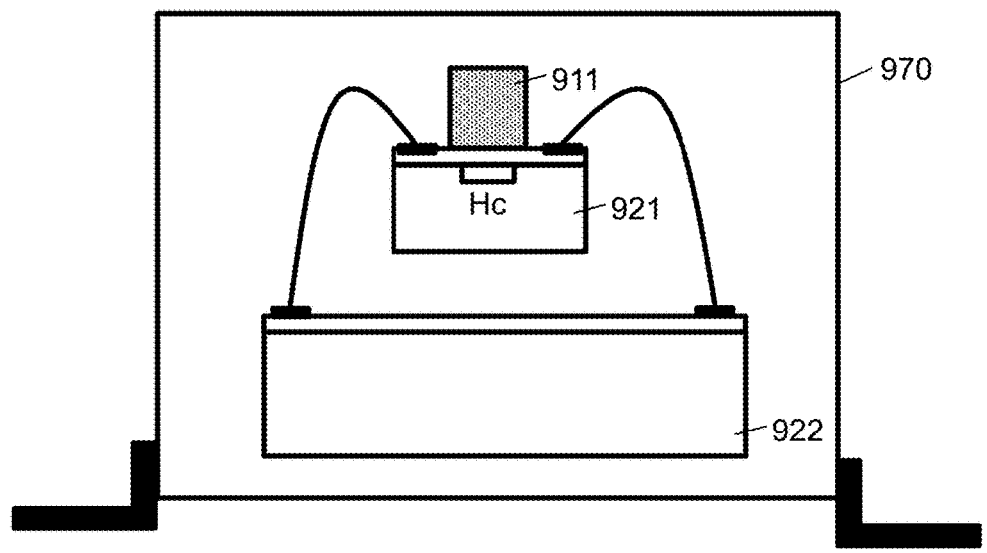
FIG. 9(b) is a schematic representation of a sensor device according to an embodiment of the present invention, comprising two semiconductor substrates, at least one of which contains a sensor structure as described above, e.g.

FIG. 9(b) is a schematic representation of a sensor device 970 comprising two semiconductor dies stacked on top of each other. In the example, the first semiconductor die 922 may or may not comprise magnetic sensor elements, and may or may not comprise integrated magnetic flux concentrators. The second semiconductor die 921 comprises a sensor arrangement as described above, containing a horizontal Hall element Hc and a magnetic flux concentrator 911 aligned thereto. The two semiconductor dies may be interconnected in known manners, for example by means of bond wires. It is an advantage of using two separate semiconductor dies in that it allows to optimize the process for each semiconductor substrate independently.

In a variant (not shown), the sensor device may comprise two separate semiconductor dies arranged side-by-side.

Figure 10:
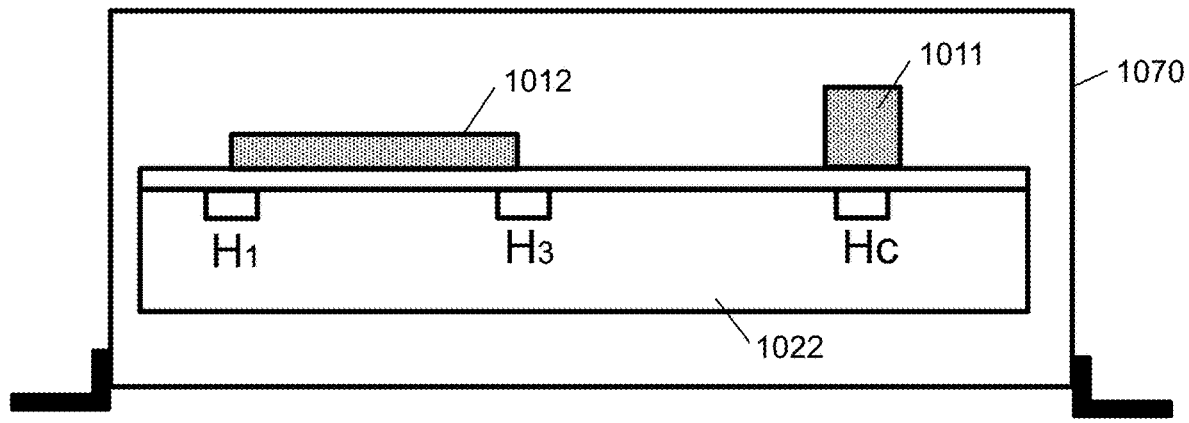
FIG. 10 is a schematic representation of a semiconductor substrate comprising a Hall-sensor arrangement with a pair of Horizontal Hall elements arranged at the periphery of a disk or ring or sun shaped IMC (shown on the left of FIG. 10) and comprising a sensor structure as shown in FIG. 2(c) or FIG. 4(a) to FIG. 4(c) (shown on the right of FIG. 10), implemented on the same substrate.

FIG. 10 is a schematic representation of a sensor device 1070 comprising a semiconductor substrate 1022. The semiconductor substrate 1022 comprises both a classical magnetic sensor structure, e.g. comprising a ring-shaped or disk-shaped IMC and at least two horizontal Hall elements H1, H3 arranged in the vicinity of the periphery of the IMC. The semiconductor substrate 1022 further comprises an integrated magnetic flux concentrator 1011 which is aligned to a horizontal Hall element Hc, as described above. The main purpose of this figure is to show that a single semiconductor substrate may comprise different kinds of integrated magnetic concentrators, with the same height, or with different heights.

In a variant of the embodiments 1000, the classical sensor structure may contain for example a plurality of radially oriented elongated IMC-components, and a plurality of horizontal Hall elements arranged near a periphery of these elongated IMC-components, e.g. similar to those shown in FIG. 8(a) or FIG. 8(b).

Figure 11:
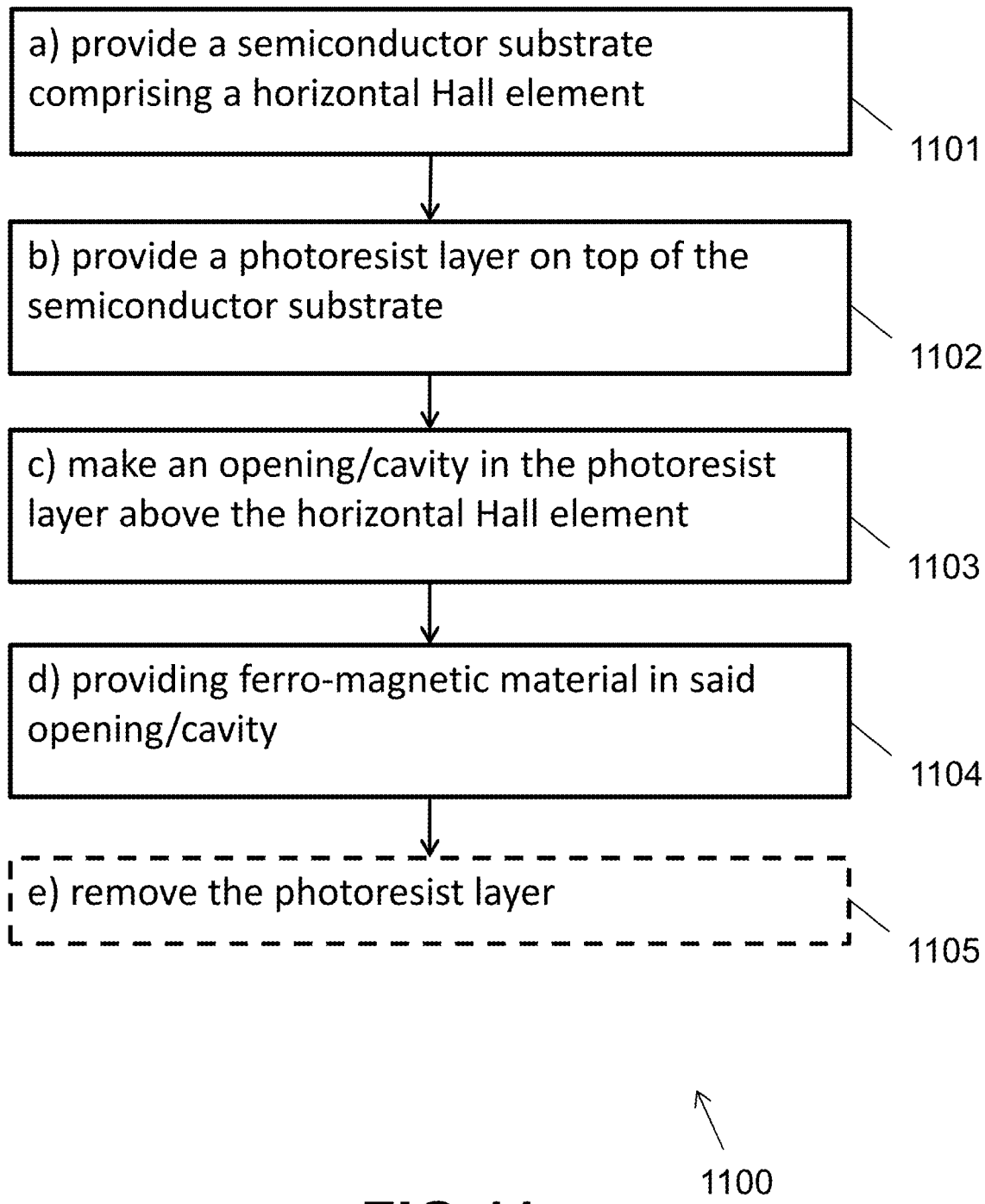
FIG. 11 shows a flow-chart of a method of producing a sensor device comprising a magnetic sensor structure as shown in FIG. 2(c) or FIG. 4(a) to FIG. 4(c).
Figure 12:
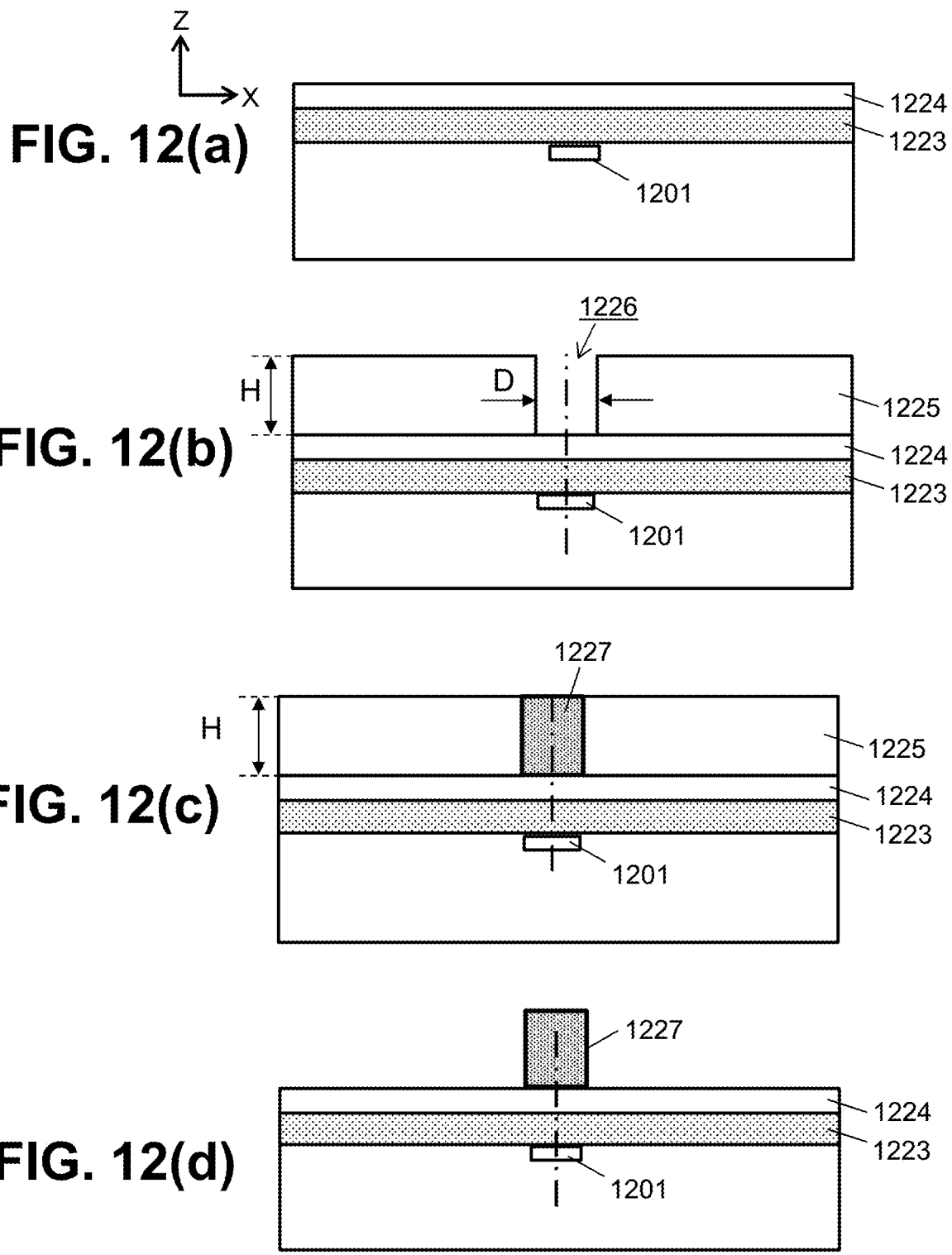
FIG. 12, including

FIG. 11 shows a flowchart of a method that can be used for producing an integrated sensor device comprising a magnetic sensor structure as described above (see e.g. FIG. 2(c) or FIG. 4(a) to FIG. 4(c)), and FIG. 12 shows intermediate structures obtained at various steps of the method. The method comprises the steps of:

a) providing 1101 a semiconductor substrate comprising a horizontal Hall element.

An example of such a substrate is shown in FIG. 12(a). The substrate may be a CMOS substrate, comprising a semiconductor material (e.g. Si or GaAs) having an active surface in which the horizontal Hall element 1201 is implemented. The substrate may further comprise an "interconnection stack" 1223 (also referred to as "metal stack") comprising at least four metal layers separated by insulation layers. The substrate may further comprise a top layer 1224, e.g. a passivation layer, e.g. comprising or consisting of silicon oxide or silicon nitride.

b) providing 1102 a photoresist layer 1225 on top of the semiconductor substrate.

Providing a photoresist layer can be done for example by spin-coating.

c) making 1103 an opening 1226 or a cavity in the photoresist layer 1225, such that a centre of the opening 1226 or the cavity is substantially aligned with a centre of the horizontal Hall element 1201, and such that a height (H) of the opening measured in the Z-direction perpendicular to the semiconductor substrate is at least 25% of a transversal dimension (D) of the opening measured in a direction parallel to the semiconductor substrate (e.g. X or Y);

Making an opening in the photoresist layer 1255 can be done for example by photolithography. The height of the opening may be defined by the height of the photoresist layer 1225. The transversal dimension of the opening may be defined by patterning. The area of the bottom surface of the opening 1226 may be larger, substantially equal to, or smaller than the area of the horizontal Hall element 1201. An example of a substrate obtained after performing step b) and c) is shown in FIG. 12(b).

d) depositing 1104 a soft magnetic material inside the opening or cavity, so as to form an integrated magnetic concentrator having a shape with a height (H) and a transverse dimension (D), wherein the height is at least 50% of the transverse dimension.

Depositing a soft magnetic material can for example be done by electroplating. The soft magnetic material may be Fe, or Ni, or FeNi, or Fe-based alloys, or Ni-based alloys, or FeNi-based alloys.

An example of a substrate obtained after performing step d) is shown in FIG. 12(c).

The method may further comprise optional step e) after step d) of removing 1105 the photoresist layer 1225.

An example of a substrate obtained after performing steps e) is shown in FIG. 12(d).

Of course, depending on the specific implementation, the method may comprise further steps, such as e.g. providing a seed layer before performing electroplating. These steps and their purpose are well known in the art, and hence need not be explained in more detail here.

In a variant of the method, step c) comprises making an opening with H/D>30%, or H/D>40%, or H/D>50%, or H/D>60%, or H/D>70%.

FIG. 13 illustrates intermediate structures as can be obtained by a variant of the method shown in FIG. 11.

The intermediate structure shown in FIG. 13(a) is similar to that of FIG. 12(a). It comprises a semiconductor substrate with an active surface and a horizontal Hall element 1301, and comprises an interconnection stack 1323, and a passivation layer 1324.

The intermediate structure shown in FIG. 13(b) can be obtained by providing a photoresist layer 1325 on top of the substrate of FIG. 13(a), and by making an opening 1326 in the photoresist layer 1325 (e.g. by patterning and etching). However, in contrast to what is usually done in the prior art, the opening 1326 is made such that it penetrates partially inside the interconnection stack 1323. This can be achieved by partially etching one or more of the isolation layers and/or metal layers of the interconnection stack 1323. In the specific example of FIG. 13(b), the interconnection stack 1323 contains four metal layers M1, M2, M3, M4, and the opening 1326 extends to abut a metallic etch stop 1328 provided in the third metal layer M3, but the present invention is not limited thereto, and in a variant, the metallic etch stop may be provided in another metal layer, or may even be omitted. When omitted, the depth of the opening may be determined by timing of the etching process, in manners known per se in the art.

The structure shown in FIG. 13(c) can be obtained by depositing a soft magnetic material, e.g. a ferromagnetic material in the opening or cavity 1327, e.g. by electroplating.

The structure shown in FIG. 13(d) can be obtained by removing the photoresist layer, which is optional.

The interested reader may find further variants and/or more details of how the opening in the interconnection layer 1323 can be made in co-pending patent application EP19176438.0, filed by the same applicant on 24 May 2019, incorporated herein by reference in its entirety. All techniques and materials mentioned in this earlier EP-application are also envisioned as possible variations or enhancements of the methods described herein.

The main difference between the structure of FIG. 13(c) and the structure of FIG. 12(c) is that the magnetic flux concentrator 1327 is located closer to the Hall element 1301, thus the distance "d" between the Hall element and the bottom surface of the magnetic flux concentrator 1327 is reduced, which may be beneficial for the magnetic gain Gz.

While the original problem (illustrated in FIG. 1) and the solution proposed in FIG. 2 was related to a sensor device having four horizontal Hall elements, of course, the present invention is not limited to devices having four horizontal Hall elements, but also works for sensor device having at least one horizontal Hall element with an iMFC aligned thereto. What follows is provided for completeness and will not be described in full detail.

FIG. 14(a) and FIG. 14(b) shows another embodiment of a magnetic sensor structure, containing two structures as shown in FIG. 2(c) or FIG. 4(a) to FIG. 4(c), spaced apart over a distance Δx along an axis, in perspective view and in top view respectively. This structure is capable of measuring Bz1, Bz2 and dBz/dx. This structure can be used for example in a current sensor device.

FIG. 15(a) is a top view of a magnetic sensor structure containing three structures as shown in FIG. 2(c) or FIG. 4(a) to FIG. 4(c), spaced apart equidistantly along an axis.

FIG. 15(b) is a schematic representation of a linear position sensor containing a multi-pole magnetic structure, and a magnetic sensor structure as shown in FIG. 15(a).

FIG. 15(c) is a schematic representation of an angular position sensor containing a four-pole ring magnet, and a magnetic sensor structure as shown in FIG. 15(a), located off-axis.

FIG. 15(d) shows a variant of the magnetic sensor structure of FIG. 15(a), where the sensor elements are located on a triangle, as can be used in a linear or angular position sensor system.

FIG. 15(e) shows a variant of the magnetic sensor structure of FIG. 15(a), containing four sensor elements, equidistantly spaced along an axis, as can be used in a linear or angular position sensor system.

FIG. 15(f) shows a variant of the magnetic sensor structure of FIG. 15(a), containing four sensor elements located on a trapezium, as can be used in a linear or angular position sensor system.

The interested reader can find more details about how an angle or linear position can be derived from the sensor signals in patent application EP20173760.8, filed by the same applicant on 8 May 2020, and incorporated herein by reference, which therefore need not be repeated here.

FIG. 16(a) and FIG. 16(b) show a variant of the magnetic sensor structure of FIG. 2(a) in perspective view and in top view, containing only three sensor structures as shown in FIG. 2(c), located on a virtual circle, and angularly spaced by multiples of 120°.

FIG. 16(c) shows an angular sensor device 1620 comprising a magnetic sensor structure as shown in FIG. 16(a) and FIG. 16(b) and shows an angular system 1650 comprising this sensor device 1620, and further comprising a two-pole magnet. In the embodiment shown in FIG. 16(c), the magnet is a two-pole disk magnet, but the present invention is not limited thereto, and other two-pole magnets can also be used, e.g. a two-pole ring magnet or a two-pole bar magnet.

A similar sensor device, but without the integrated magnetic flux concentrators is known in the art, and hence need not be described in more detail here. Suffice it to say that the magnetic field provided by the magnet is sensed by the three Hall elements as three sinusoidal signals which are 120° phase shifted, from which signals an angular position can be derived.

FIG. 17(a) and FIG. 17(b) show a variant of the magnetic sensor structure of FIG. 2(a) and FIG. 16(a) in perspective view and in top view, containing six sensor structures as shown in FIG. 2(c) or FIG. 4(a) to FIG. 4(c), located on a virtual circle, and angularly spaced by multiples of 60°.

FIG. 17(c) shows an angular sensor device 1720 comprising a magnetic sensor structure as shown in FIG. 17(a) and FIG. 17(b) and shows an angular system 1750 comprising this sensor device 1720, and further comprising a four-pole magnet. In the embodiment shown in FIG. 17(c), the four-pole magnet is a four-pole disk magnet, but the present invention is not limited thereto, and other four-pole magnets can also be used, e.g. a four-pole ring magnet.

From the above it shall be clear that the magnetic sensor structure shown in FIG. 2(c) or FIG. 4(a) to FIG. 4(c) can be used in all solutions where currently a horizontal Hall without an integrated magnetic flux concentrator is used, and for the same purpose (measuring a magnetic field component perpendicular to the semiconductor substrate) but with an improved signal to noise ratio (SNR).

The invention claimed is:

1. An integrated sensor device comprising:
a semiconductor substrate comprising a first horizontal Hall element, and a first integrated magnetic flux concentrator located above said first horizontal Hall element;
wherein the first magnetic flux concentrator has a shape with a geometric center which is aligned with a geometric centre of the horizontal Hall element;
wherein the integrated sensor device further comprises a second horizontal Hall element and a second integrated magnetic flux concentrator located above said second horizontal Hall element;
wherein the second magnetic flux concentrator has a second shape with a geometric center which is aligned with a geometric centre of the second horizontal Hall element in a direction perpendicular to the semiconductor substrate;
wherein the second horizontal Hall element is spaced from the first horizontal Hall element in a first direction X parallel to the semiconductor substrate;
and wherein the integrated sensor device is further configured for determining a difference signal or a gradient signal dBz/dx.

2. The integrated sensor device according to claim 1,
wherein the shape has a height in a direction perpendicular to the semiconductor substrate, and has a largest transversal dimension in a direction parallel to the semiconductor substrate;
and wherein a height of the magnetic flux concentrator is at least 30 μm, and/or wherein a ratio of the height and said largest transversal dimension is at least 25%.

3. The integrated sensor device according to claim 2,
wherein the height of the first and second integrated magnetic concentrator is a value in a range from 30 μm to 500 μm.

4. The integrated sensor device according to claim 1,
wherein the second horizontal Hall element is spaced from the first horizontal Hall element by a distance Δx in a range from 1.0 mm to 2.5 mm.

5. The integrated sensor device according to claim 1,
wherein the shape of the first integrated magnetic flux concentrator is an overall cylindrical shape, or an overall conical shape, or an overall truncated conical shape, or a rotation symmetric shape, or a circular symmetric shape about a longitudinal axis, or has an overall prism shape with a regular polygonal cross-section, or has an overall mushroom shape, or comprises a mainly cylindrical portion, or comprises a mainly conical portion, or comprises a mainly truncated conical portion.

6. The integrated sensor device according to claim 1,
wherein a cross-section of the shape of the integrated magnetic flux concentrator in a plane parallel to the semiconductor substrate has a diameter or a largest diagonal in a range from 15 to 40 μm.

7. The integrated sensor device according to claim 1,
wherein an orthogonal projection of the horizontal Hall element onto the substrate is located completely inside a periphery of an orthogonal projection of a bottom surface of the integrated magnetic flux concentrator onto said substrate;
or wherein an orthogonal projection of a bottom surface of the integrated magnetic flux concentrator onto the substrate is located completely inside a periphery of an orthogonal projection of the horizontal Hall element onto said substrate;
or wherein a periphery of an orthogonal projection of the horizontal Hall element onto the substrate intersects a periphery of an orthogonal projection of a bottom surface of the integrated magnetic flux concentrator onto said substrate.

8. An integrated sensor device according to claim 1,
wherein each of the first and second horizontal Hall element has a first area;
and wherein each of the first and second integrated magnetic concentrator has a bottom surface with a second area;
wherein a ratio of the first area and the second area is a value in a range from 50% to 200%.

9. The integrated sensor device according to claim 1,
wherein a distance between the first horizontal Hall element and the first integrated magnetic flux concentrator is smaller than 25 μm.

10. The integrated sensor device according to claim 1,
comprising two separate semiconductor dies arranged side-by-side;
wherein said first horizontal Hall element and said first integrated magnetic flux concentrator are integrated on a first semiconductor substrate;
and wherein said second horizontal Hall element and said second integrated magnetic flux concentrator are integrated on a second semiconductor substrate.

11. The integrated sensor device according to claim 1, wherein the integrated sensor device is configured as a current sensor device.

12. A current sensor comprising:
the integrated sensor device according to claim 11;
and an external electrical conductor.

13. The integrated sensor device according to claim 1,
further comprising an electrical conductor integrated in the integrated sensor device.

14. A linear position sensor comprising:
the integrated sensor device according to claim 1;
wherein the semiconductor substrate further comprises a third horizontal Hall element, and a third integrated magnetic concentrator;
and wherein the first, second and third horizontal Hall element are arranged on a virtual line and are equidistantly spaced from each other.

15. An angular position sensor comprising:
the integrated sensor device according to claim 1;
wherein the semiconductor substrate further comprises a second horizontal Hall element vertically aligned with a second integrated magnetic concentrator, and a third horizontal Hall element, vertically aligned with a third integrated magnetic concentrator;
and wherein the first, second and third horizontal Hall element are arranged on a virtual circle, and are angularly spaced apart by multiples of 120°.

16. The angular position sensor of claim 15,
further comprising a two-pole magnet.

17. An angular position sensor comprising:
the integrated sensor device according to claim 1;
wherein the semiconductor substrate further comprises a second horizontal Hall element vertically aligned with a second integrated magnetic concentrator, and a third horizontal Hall element, vertically aligned with a third integrated magnetic concentrator, and a fourth horizontal Hall element, vertically aligned with a fourth integrated magnetic concentrator, and a fifth horizontal Hall element, vertically aligned with a fifth integrated magnetic concentrator, and a sixth horizontal Hall element, vertically aligned with a sixth integrated magnetic concentrator;

and wherein the first, second, third, fourth, fifth and sixth horizontal Hall element are arranged on a virtual circle, and are angularly spaced apart by multiples of 60°.

18. The angular position sensor of claim 17, further comprising a two-pole magnet or a four-pole magnet.

19. An integrated sensor device comprising:

a semiconductor substrate comprising a first horizontal Hall element, and a first integrated magnetic flux concentrator located above said first horizontal Hall element;

wherein the first magnetic flux concentrator has a shape with a geometric center which is aligned with a geometric centre of the horizontal Hall element;

wherein the integrated sensor device further comprises a second horizontal Hall element and a second integrated magnetic flux concentrator located above said second horizontal Hall element;

wherein the second magnetic flux concentrator has a second shape with a geometric center which is aligned with a geometric centre of the second horizontal Hall element in a direction perpendicular to the semiconductor substrate;

wherein the second horizontal Hall element is spaced from the first horizontal Hall element in a first direction X parallel to the semiconductor substrate;

wherein the integrated sensor device is further configured for determining a difference signal or a gradient signal dBz/dx;

wherein the semiconductor substrate comprises an interconnection stack comprising at least four metal layers separated by a plurality of insulation layers;

and wherein at least a portion of the integrated magnetic flux concentrator is situated inside the interconnection stack.

20. An integrated sensor device comprising:

a semiconductor substrate comprising a first horizontal Hall element, and a first integrated magnetic flux concentrator located above said first horizontal Hall element;

wherein the first magnetic flux concentrator has a shape with a geometric center which is aligned with a geometric centre of the horizontal Hall element;

wherein the integrated sensor device further comprises a second horizontal Hall element and a second integrated magnetic flux concentrator located above said second horizontal Hall element;

wherein the second magnetic flux concentrator has a second shape with a geometric center which is aligned with a geometric centre of the second horizontal Hall element in a direction perpendicular to the semiconductor substrate;

wherein the second horizontal Hall element is spaced from the first horizontal Hall element in a first direction X parallel to the semiconductor substrate;

wherein the integrated sensor device is further configured for determining a difference signal or a gradient signal dBz/dx;

wherein the semiconductor substrate has an active surface comprising said horizontal Hall element, and a passive surface; and wherein the integrated magnetic flux concentrator is located on a side of the active surface or wherein the integrated magnetic flux concentrator is located on a side of the passive surface.

\* \* \* \* \*